US011604150B2

(12) United States Patent
Okuzono et al.

(10) Patent No.: US 11,604,150 B2
(45) Date of Patent: Mar. 14, 2023

(54) DEVICE FOR MEASURING BUMP HEIGHT, APPARATUS FOR PROCESSING SUBSTRATE, METHOD OF MEASURING BUMP HEIGHT, AND STORAGE MEDIUM

(71) Applicant: EBARA CORPORATION, Tokyo (JP)

(72) Inventors: Takahisa Okuzono, Tokyo (JP); Masaki Tomita, Tokyo (JP); Jumpei Fujikata, Tokyo (JP); Hideki Takayanagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 91 days.

(21) Appl. No.: 17/256,921

(22) PCT Filed: Jun. 27, 2019

(86) PCT No.: PCT/JP2019/025576
§ 371 (c)(1),
(2) Date: Dec. 29, 2020

(87) PCT Pub. No.: WO2020/004544
PCT Pub. Date: Jan. 2, 2020

(65) Prior Publication Data
US 2021/0285893 A1 Sep. 16, 2021

(30) Foreign Application Priority Data

Jun. 29, 2018 (JP) .............................. JP2018-125427

(51) Int. Cl.
*G01N 21/95* (2006.01)
*G01B 11/06* (2006.01)
(Continued)

(52) U.S. Cl.
CPC ......... *G01N 21/9501* (2013.01); *G01B 11/06* (2013.01); *G01N 21/45* (2013.01); *H01L 24/14* (2013.01)

(58) Field of Classification Search
CPC .... G01N 21/9501; G01N 21/45; G01B 11/06; H01L 24/14
(Continued)

(56) References Cited

U.S. PATENT DOCUMENTS

| 7,130,037 B1* | 10/2006 | Lange ................. G03F 7/70341 |
| | | 356/237.5 |
| 2001/0024691 A1 | 9/2001 | Kimura et al. |
| 2004/0227953 A1 | 11/2004 | Mathur |
| 2012/0127477 A1* | 5/2012 | Kuramoto .......... G01B 9/02003 |
| | | 356/498 |
| 2017/0176328 A1* | 6/2017 | Jak ...................... G03F 7/70641 |
| 2017/0256465 A1* | 9/2017 | Van Leest ........... G03F 7/70633 |

FOREIGN PATENT DOCUMENTS

| JP | 62-182612 A | 8/1987 |
| JP | 05-296731 A | 11/1993 |

(Continued)

OTHER PUBLICATIONS

International Patent Application No. PCT/JP2019/025576; Int'l Written Opinion and Search Report; dated Sep. 10, 2019; 6 pages.

*Primary Examiner* — Michael A Lyons
*Assistant Examiner* — Omar H Nixon
(74) *Attorney, Agent, or Firm* — BakerHostetler

(57) ABSTRACT

An object is to allow for simple measurement of a bump height. There is provided a device for measuring a bump height comprising: a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element; and a control device configured to calculate a height of the bump relative to the seed layer, based on the reflected light from the seed layer and the reflected light from the bump and to subtract an error caused by a refractive index of the resist layer from (Continued)

the height of the bump calculated based on the reflected lights, so as to correct the height of the bump.

25 Claims, 22 Drawing Sheets

(51) Int. Cl.
    *G01N 21/45*     (2006.01)
    *H01L 23/00*     (2006.01)

(58) Field of Classification Search
    USPC .......................................................... 356/498
    See application file for complete search history.

(56) References Cited

FOREIGN PATENT DOCUMENTS

| | | | |
|---|---|---|---|
| JP | 2000-040867 A | | 2/2000 |
| JP | 2002-190455 A | | 7/2002 |
| JP | 2005-140584 A | | 6/2005 |
| JP | 2009-109450 A | | 5/2009 |
| JP | 2010-044024 A | | 2/2010 |
| JP | 2012-078302 A | | 4/2012 |
| JP | 2012078302 A | * | 4/2012 |
| JP | 2017-009514 A | | 1/2017 |
| KR | 20060084852 A | * | 7/2006 ........... G01B 9/0209 |

* cited by examiner

DEVICE FOR MEASURING BUMP HEIGHT, APPARATUS FOR PROCESSING SUBSTRATE, METHOD OF MEASURING BUMP HEIGHT, AND STORAGE MEDIUM

TECHNICAL FIELD

The present disclosure relates to a device for measuring a bump height, an apparatus for processing a substrate, a method of measuring a bump height, and a storage medium configured to store a program that causes a computer to perform a method of controlling the device for measuring a bump height

BACKGROUND ART

A plating apparatus is provided with a configuration that measures the plating film thickness of a substrate after a plating process and stops the plating process in the event of an abnormality of the plating film thickness. For example, an applicable procedure peels off a resist from a plated substrate and measures the plating film thickness by using a film thickness measuring instrument provided outside of the plating apparatus. In this case, the plating process of substrates is likely to continue until acquisition of the abnormality of the plating film thickness and produce a large number of substrates having the abnormality in film thickness distribution.

As an example of providing a film thickness measuring instrument in the plating apparatus, Japanese Unexamined Patent Publication No. 2002-190455 (Patent Document 1) describes a semiconductor manufacturing apparatus provided with a pre-plating/post-plating film thickness measuring instrument configured to measure the film thicknesses before and after plating. This configuration requires measurement of the film thicknesses before and after plating by the pre-plating/post-plating film thickness measuring instrument and is thus likely to reduce the throughput.

Japanese Unexamined Patent Publication No. 2002-190455 (Patent Document 1) also describes a first aligner/film thickness measurement unit and a second aligner/film thickness measurement unit. This configuration, however, requires measurement of the film thickness of the substrate before plating by the first aligner/film thickness measurement unit and measurement of the film thickness of the substrate after plating by the second aligner/film thickness measurement unit and is thus likely to reduce the throughput. This configuration is alternatively provided with multiple film thickness measurement units for different purposes and is thus likely to increase the device cost.

RELATED ART DOCUMENT

Patent Document

Patent Document 1: Japanese Unexamined Patent Publication No. 2002-190455

SUMMARY OF INVENTION

Technical Problem

An object of the present disclosure is to solve at least part of the problems described above.

Solution to Problem

According to one aspect of the present disclosure, there is provided a device for measuring a bump height comprising: a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element; and a control device configured to calculate a height of the bump relative to the seed layer, based on the reflected light from the seed layer and the reflected light from the bump and to subtract an error caused by a refractive index of the resist layer from the height of the bump calculated based on the reflected lights, so as to correct the height of the bump.

According to one aspect of the present disclosure, there is provided a device for measuring a bump height comprising: a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer, reflected light that is directly reflected from the seed layer, and reflected light that is reflected from the bump, by the light-receiving element; and a control device configured to measure a height of the seed layer, based on the reflected light that is reflected from the seed layer via the resist layer and the reflected light that is directly reflected from the seed layer, to measure a height of the bump, based on the reflected light that is reflected from the seed layer via the resist layer and the reflected light that is reflected from the bump, and to subtract the height of the seed layer from the height of the bump, so as to obtain the height of the bump relative to the seed layer.

DESCRIPTION OF EMBODIMENTS

The following describes embodiments of the present disclosure with reference to drawings. In the respective embodiments given below, like or equivalent members are expressed by like reference signs, and duplicated description is omitted. Although the expressions such as "upper (on, above)", "lower (under, below)", "left" and "right" are used in the description hereof, these expressions only indicate the positions and the directions on the sheet surfaces of the illustrative drawings for the purpose of explanation and may be different from the positions and the directions in the actual layout, for example, during use of the apparatus. The arrangement that a certain member and another member are "located opposite to each other across a substrate" means that a certain member is located to be opposed to one substrate face of a substrate and that another member is located to be opposed to an opposite substrate face, which is on a side opposite to the one substrate face. In the substrate, wirings may be formed in either one of two faces or wirings may be formed in both the two faces.

Figure 1:
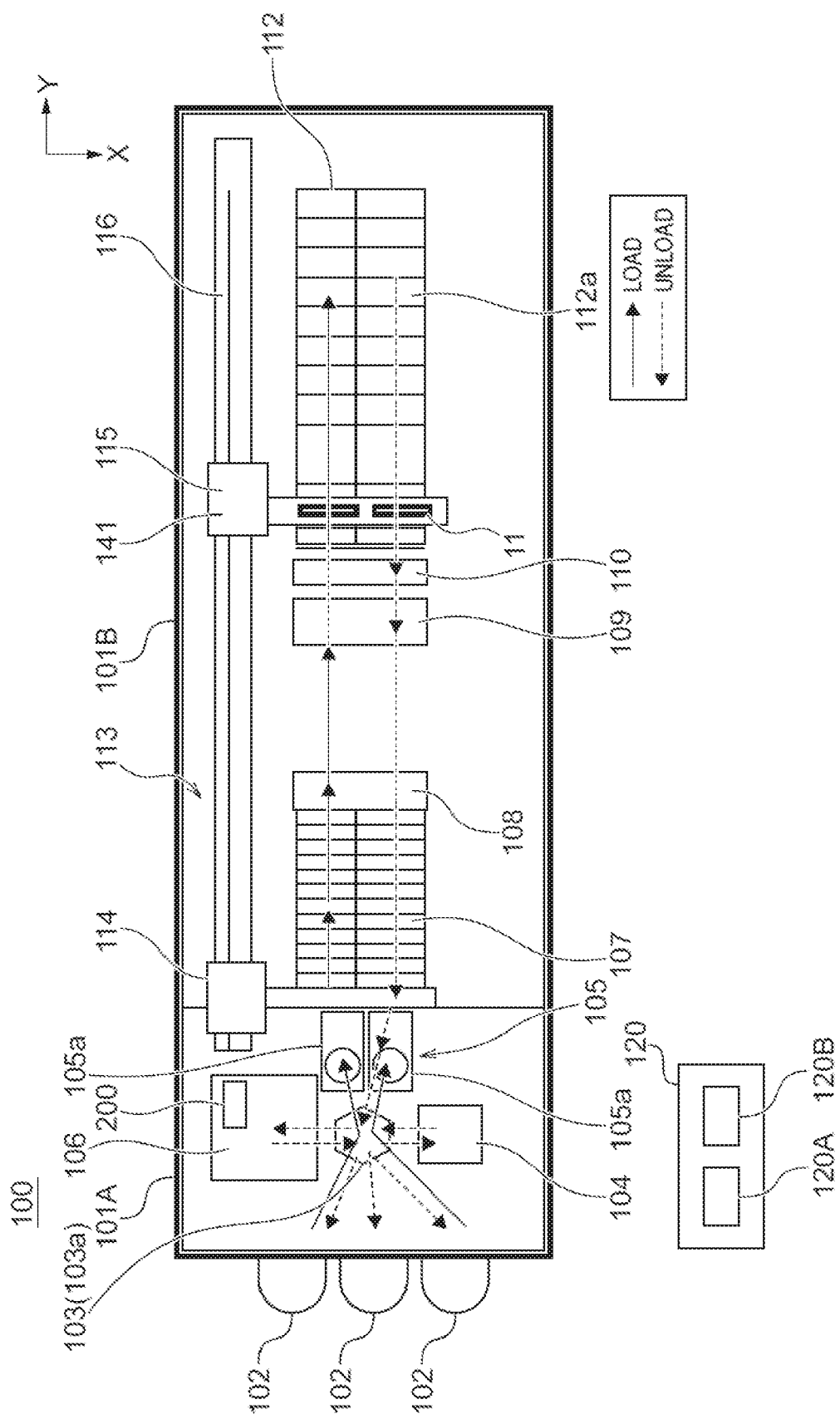
FIG. 1 is a general layout drawing illustrating a substrate processing apparatus according to one embodiment of the present disclosure.

FIG. 1 is a general layout drawing illustrating a substrate processing apparatus according to one embodiment of the present disclosure. In this embodiment, the substrate processing apparatus 100 is an electroplating apparatus. Although this embodiment describes the electroplating apparatus as an example, the present disclosure is applicable to any plating apparatus.

The substrate processing apparatus 100 is roughly divided into a load/unload module 101A configured to load a substrate W as an object to be processed to a substrate holder 11 as a substrate holding member or unload the substrate W from the substrate holder 11; and a processing module 101B configured to process the substrate W. The substrate W includes objects to be processed in a circular shape, in a rectangular shape, and in any other shapes. The substrate W includes a semiconductor wafer, a glass substrate, a liquid crystal substrate, a printed circuit board and other objects to be processed. The substrate holder 11 includes, for example, a first holding member and a second holding member (illustration is omitted) and is configured such that the substrate W is placed between and held by the first holding member and the second holding member. The substrate holder 11 is provided with an opening that makes a single face or both faces of the substrate W exposed and is also provided with electrodes (contacts) that are brought into contact with an outer circumferential part of the substrate W to supply electric current.

The load/unload module 101A includes a plurality of cassette tables 102, an aligner 104, a substrate mounting/demounting module 105, a dryer 106, and a bump height measurement device (bump height inspection device) 200 placed to inspect the substrate W in the dryer 106. The cassette table 102 is configured to mount thereon a cassette with the substrate W placed therein. The aligner 104 is configured to adjust the position of an orientation flat, a notch or the like of the substrate W to a predetermined direction. The substrate mounting/demounting module 105 includes one or a plurality of substrate mounting/demounting devices 105a configured to mount and demount the substrate W to and from the substrate holder 11. The dryer 106 is configured to spin the substrate W after a plating process at a high speed and thereby dry the substrate. A substrate transporter 103 is placed in the middle of these units and is provided with a transfer robot 103a configured to transfer or convey the substrate W between these units.

The processing module 101B includes a stocker 107 configured to store and temporarily place the substrate holder 11, a pre-wet module 108, a blow module 109, a rinse module 110, and a plating process module (plating module) 112. The pre-wet module 108 serves to soak the substrate W prior to the plating process in pure water. The rinse module 110 serves to clean the substrate W after the plating process along with the substrate holder 11 by using a cleaning liquid. The blow module 109 serves to drain the liquid from the substrate W after cleaning. The plating process module 112 includes a plurality of plating cells 112a provided with an overflow tank. Each of the plating cells 112a serves to place one substrate W inside thereof and soak the substrate W in a plating solution kept inside thereof to plate the surface of the substrate with copper or the like. The type of the plating solution used herein is not specifically limited, but any of various plating solutions may be used according to the purposes. This embodiment describes the case of forming a bump on the surface of the substrate by the plating process as an example. This configuration of the processing module 101B of the substrate processing apparatus 100 is only illustrative, and another configuration may be employed.

The substrate processing apparatus 100 includes a substrate holder transfer device 113 that is located on a lateral side of these respective devices and modules and that employs any driving system (for example, a linear motor system) to transfer or convey the substrate holder 11 between these respective devices and modules. This substrate holder transfer device 113 includes a first transporter 114 and a second transporter 115. The first transporter 114 and the second transporter 115 are configured to run on a rail 116. The first transporter 114 serves to transfer or convey the substrate holder 11 between the substrate mounting/demounting module 105 and the stocker 107. The second transporter 115 serves to transfer or convey the substrate holder 11 between the stocker 107, the pre-wet module 108, the blow module 109, the rinse module 110 and the plating cells 112a. A modified configuration may be provided with only the first transporter 114 with omission of the second transporter 115 and may use the first transporter 114 to perform the transfer between the above respective components.

A plating system including the substrate processing apparatus 100 having the configuration described above includes a control device 120 configured to control the respective components described above. The control device 120 includes a memory 120B configured to store a variety of set data and various programs therein, a CPU 120A configured to execute the programs stored in the memory 120B, and a device controller (not shown) comprised of, for example, a sequencer configured to control the respective components described above in a control command from the CPU 120A. The CPU 120A controls the respective components of the substrate processing apparatus 100 via and/or not via the device controller. The control device 120 may be configured by, for example, a device computer including the CPU 120A and the memory 120B and the device controller.

A storage medium constituting the memory 120B may include any volatile storage medium and/or any non-volatile storage medium. The storage medium may include one or a plurality of arbitrary storage media, for example, a ROM, a RAM, a hard disk, a CD-ROM, a DVD-ROM, or a flexible disk. The memory 120B may be an external memory outside of the apparatus 100. The programs stored in the memory 120B include, for example, a program that performs transfer control of the substrate transporter 103, a program that performs mounting/demounting control of the substrate to and from the substrate holder in the substrate mounting/demounting module 105, a program that performs transfer control of the substrate holder transfer device 113, a program that controls the plating process in the plating process module 112, and a program that controls a processing by the bump height measurement device 200 described later. Furthermore, the control device 120 is configured to make communication with a non-illustrated upper level controller that performs integrated control of the substrate processing apparatus 100 and the other relevant devices by wire or wirelessly and to send and receive data to and from a database of the upper level controller.

Figure 7:
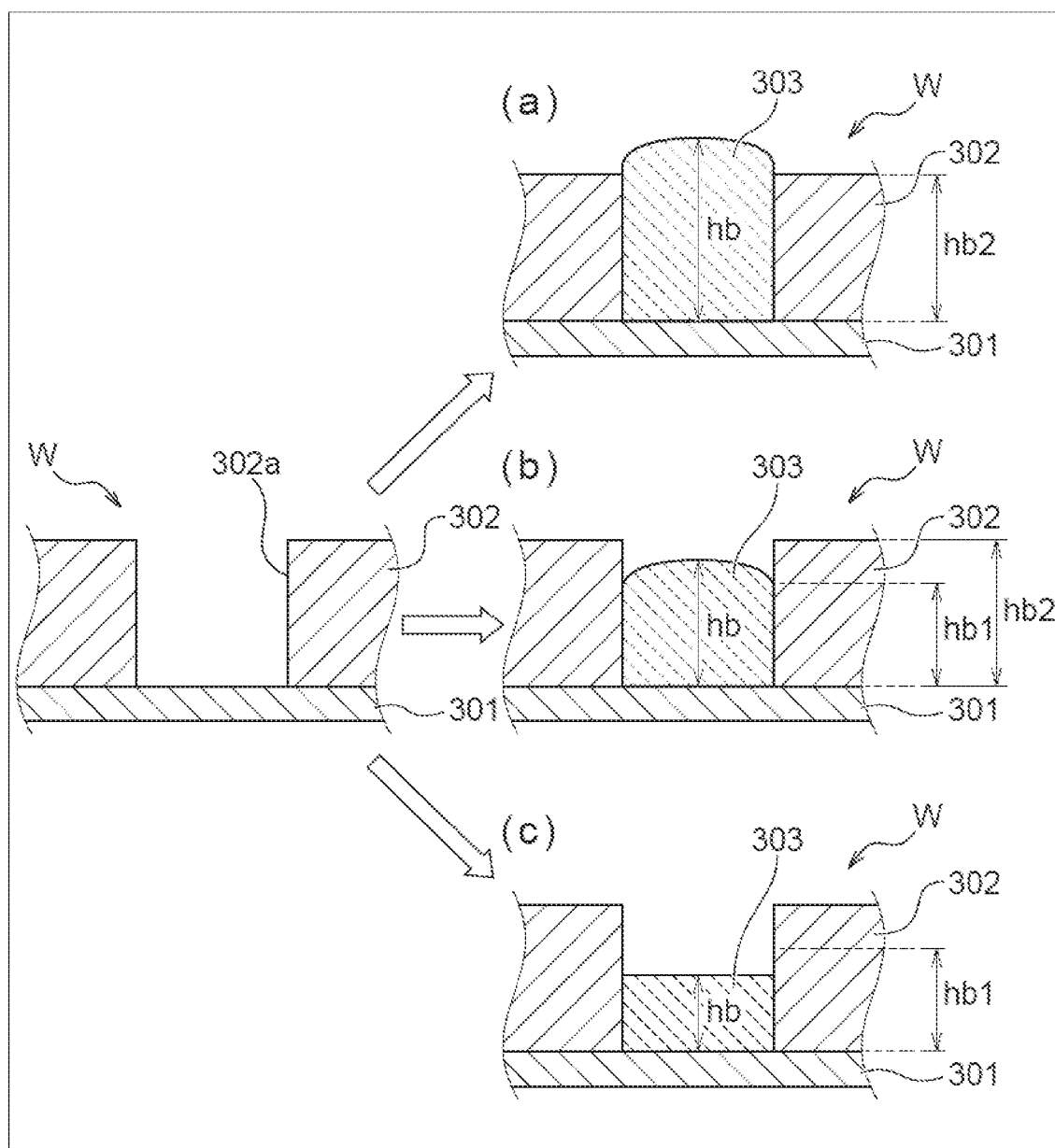
FIG. 7 is a diagram illustrating a variation in height of a bump formed on a substrate.

FIG. 7 is a diagram illustrating a variation in height of a bump formed on the substrate. In the substrate W, a resist layer 302 is formed on a seed layer 301, and an opening 302a is formed by patterning in a location of the resist layer 302 where a bump 303 is to be formed. The substrate W having the resist layer 302 patterned in this manner is transferred and carried into the substrate processing apparatus 1, and the bump 303 is formed in the opening 302a of the resist layer 302 by an electroplating process. The bump 303 is a bump electrode and is used to, for example, connect a semiconductor device (chip) or a wafer manufactured by segmentation of the substrate W with another component by flip chip bonding. In FIG. 7, (a) to (c) respectively illustrate substrates W with bumps 303 of different heights formed by the plating process.

FIG. 7(a) illustrates the substrate W where the bump 303 having a height higher than a normal height range (upper limit value hb2<bump height hb) is formed. FIG. 7(b) illustrates the substrate W where the bump 303 having a height in the normal height range (lower limit value hb1 bump height hb upper limit value hb2) is formed. FIG. 7(c) illustrates the substrate W where the bump 303 having a height lower than the normal height range (bump height hb<lower limit value hb1) is formed. The lower limit value hb1 and the upper limit value hb2 respectively indicate a lower limit value and an upper limit value of the normal height range. The normal height range is, for example, a range that the height of the bump 303 is equal to or greater than a height (the lower limit value hb1) that is lower than the surface of the resist layer 302 by a predetermined height and is equal to or smaller than a height (the upper limit value hb2) that is flush with the surface of the resist layer 302. In this case, the upper limit value hb2 is a film thickness of the resist layer 302. The lower limit value hb1 and the upper limit value hb2 may be set to desired values according to the type of the substrate, the design value of the bump height and the like. For example, the upper limit value hb2 may be set to a height that is higher than the surface of the resist layer 302, and the lower limit value hb1 may be set to a height that is lower than the surface of the resist layer 302 by a predetermined height, a height that is flush with the surface of the resist layer 302 or a height that is higher than the surface of the resist layer 302.

Figure 8:
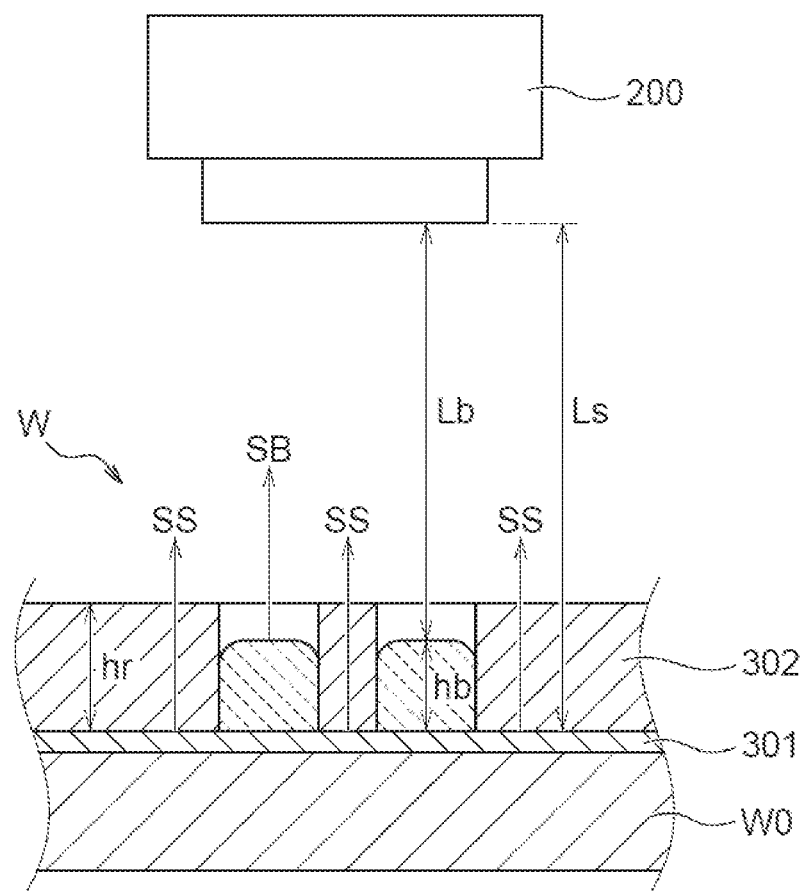
FIG. 8 illustrates a measurement principle of the bump height according to one embodiment.
Figure 9:
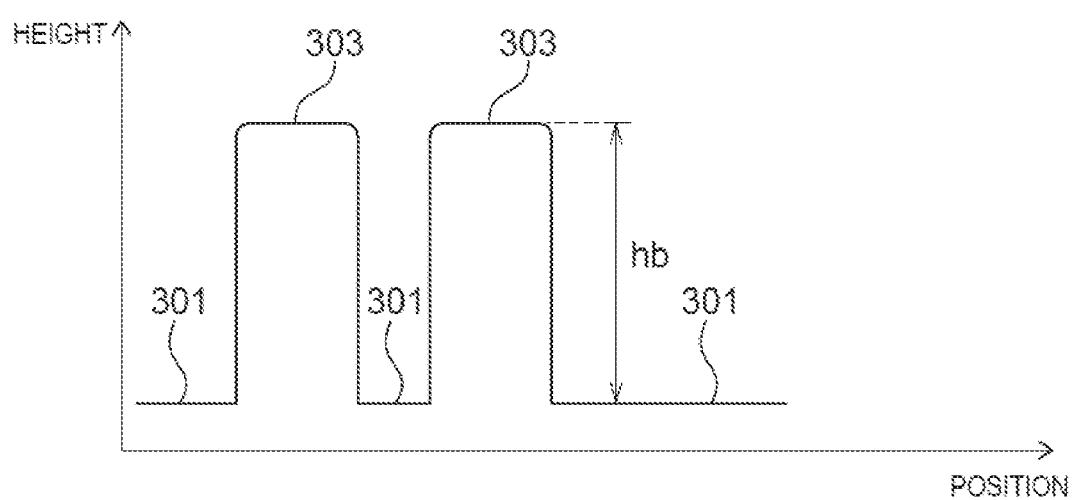
FIG. 9 illustrates a measurement example based on the measurement principle of the bump height according to one embodiment.

FIG. 8 illustrates a measurement principle of the bump height according to one embodiment. FIG. 9 illustrates a measurement example based on the measurement principle of the bump height according to one embodiment.

According to the embodiment, the height of the bump 303 is measured by the bum height measurement device 200 configured by a three-dimensional displacement meter. The three-dimensional displacement meter is, for example, a device that measures a distance to an object by white light interferometry (interference principle of white light). The bump height measurement device 200 includes a laser light source, a beam splitter, a reference mirror, and a light-receiving element, which are all not illustrated. Light emitted from the laser light source of the bump height measurement device 200 is split by the beam splitter to irradiate a surface of the substrate W as shown in FIG. 8 and to be reflected from the reference mirror in the bump height measurement device 200. The light reflected from the surface of the substrate W and the light reflected from the reference mirror enter the light-receiving element in the bump height measurement device 200 as interfering light. Height data on the substrate surface is measured or calculated, based on the intensity of the interfering light. For example, a reference plane (reference height) is set on a substrate surface, and height data on the substrate surface is measured or calculated as a difference in height relative to the reference plane. A wavelength of light transmitted through the resist layer 302 and reflected from the seed layer 301 is employed as the wavelength of the light of the laser light source. The wavelength of the light of the laser light source is a wavelength in an infrared wavelength range and is, for example, in a range of not lower than 700 nm and not higher than 1000 nm. In the example of FIG. 8, heights are measured at respective locations on the substrate surface by the bump height measurement device 200, and height data of a height profile is obtained as shown in FIG. 9. FIG. 9 illustrates a height profile indicating the heights of the surfaces of the bumps 303 and the heights of the surfaces of the seed layer 301 covered with the resist layer 302. The height data may be given in the form of a three-dimensional image.

In the case of distance measurement by using reflected light SS that is reflected from the surface of the seed layer 301 via the resist layer 302 (shown in FIG. 8), a measured distance (optical path length) Ls from the bump height measurement device 200 (a sensor head) to the seed layer 301 under the resist layer 302 is longer than an actual distance (optical path length in the air), due to a refractive index nr of the resist layer 302. This is because the refractive index nr of the resist layer 302 is larger than a refractive index n0 of the air (it is assumed herein that n0=1). When Ls represents the distance from the bump height measurement device 200 (the sensor head) to the seed layer 301 and Lb represents a distance from the bump height measurement device to the bump 303, the height hb of the bump measured by the bump height measurement device 200 is expressed by Expression (1):

$$hb = Ls - Lb \tag{1}$$

According to Expression (1), it is understood that the longer measured distance Ls to the seed layer 301 causes the measured bump height hb to become higher than an actual bump height. With regard to the height hb of the bump 303 measured by the bump height measurement device 200, there is accordingly a need to correct a distance corresponding to the thickness of the resist layer 302 by taking into account the influence of the refractive index. When the thickness of the resist layer 302 is expressed as hr, the distance corresponding to the thickness hr of the resist layer 302 is measured as nr*hr by the bump height measurement device 200, based on reflected light SB and the reflected light SS. A procedure of correction subtracts the distance nr*hr from the bump height hb measured by the three-dimensional displacement meter and adds the thickness hr of the resist layer 302 that is to be measured with the refractive index in the air. More specifically, the procedure performs correction by calculation of Expression (2) given below to exclude the influence of the refractive index of the resist layer 302 (an error caused by the refractive index of the resist layer). A corrected measurement value of the bump height is given as hb'. When the refractive index n0 in the air does not approximate 1, nr is replaced by nr/n0 in Expression (2):

$$hb' = hb - nr*hr + hr = hb - (nr-1)hr \tag{2}$$

According to Expression (2), the error caused by the influence of the refractive index nr of the resist layer 302 is expressed by Δ=(nr−1)hr. Subtracting this error Δ=(nr−1)hr from the measured bump height hb gives the bump height hb' excluding the influence of the refractive index nr of the resist layer 302.

A design value may be used as the thickness hr of the resist layer 302 in Expression (2). The thickness hr and the refractive index nr of the resist layer 302 may be set in recipe data.

Figure 12:
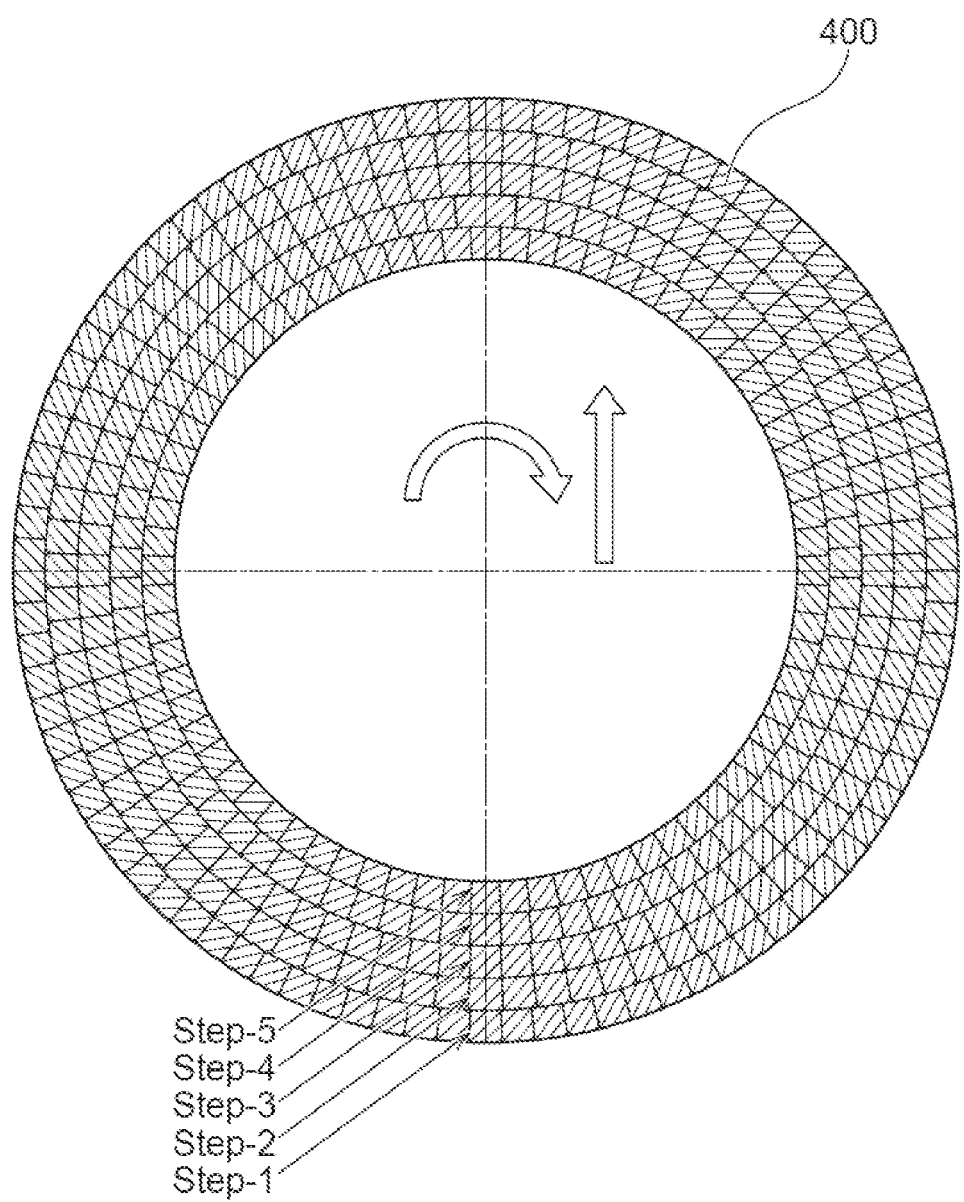
FIG. 12 illustrates a scanning example of a substrate surface by the bump height measurement device.

FIG. 12 illustrates a scanning example of the substrate surface by the bump height measurement device. In this example, an outer circumferential part of the substrate W is divided into and scanned in a plurality of steps (five steps Step 1 to Step 5 in the illustrate example) that have different positions in a radial direction of the substrate W and that are extended along the entire circumference of the substrate W. Each step corresponds to a track extended along the entire circumference of the substrate. Each step is further divided along a circumferential direction into a plurality of measurement areas 400. Each measurement area 400 shows a measurement range of each measurement of the bump height measurement device 200.

In this example, the surface of the substrate W is scanned by the bump height measurement device 200 by a procedure described below. (1) With regard to Step-1, while the substrate W is rotated, height data of the respective measurement areas 400 are measured along the entire circumference by the bum height measurement device 200. (2) The bump height measurement device 200 is moved inward in the radial direction of the substrate W, and the position of the bump height measurement device 200 is changed from Step 1 to Step 2. A similar series of processes to that described above is repeated with regard to Step 2 to Step 5, and the measurement areas 400 included in the respective Steps 1 to 5 are measured. The number of Steps to be measured and the number of the measurement areas 400 included in each step may be set via the control device 120. For example, step(s) may be added or omitted, or part of the measurement areas in each step may be omitted. In one example of omission of the measurement areas, every other measurement area among the measurement areas along the entire circumference may be specified as non-measurement areas. This configuration enables a desired measurement range to be set by taking into account the time required for measurement, the accuracy of measurement, the characteristics depending on the type of the substrate, and the like.

The following describes a reason of imaging only the pattern of the outer circumferential part of the substrate W. In the case of electroplating the substrate W held by the substrate holder 11, the contacts (electrodes) of the substrate holder 11 are brought into contact with the outer circumferential part of the substrate W, and electric current is supplied to an entire area (the outer circumferential part and an inner area thereof) of the substrate W via these contacts. Accordingly, in the event of an abnormality in the height of the bump on the substrate W, the abnormality in the height of the bump is more likely to occur in the outer circumferential part of the substrate W. Accordingly, an inspection for the bump height can be performed with sufficient accuracy by imaging the pattern of the outer circumferential part of the substrate W. In the case where any location other than the outer circumferential part is identified as a location that is more likely to have an abnormality in the height of the bump due to the characteristics of the substrate W, imaging of the identified location may be performed.

The description herein shows the case of measuring the outer circumferential part of the substrate (for example, in a range of 50 mm from an outer periphery of the substrate). A modification may measure the entire area of the substrate W including an inner circumferential part.

Figure 2:
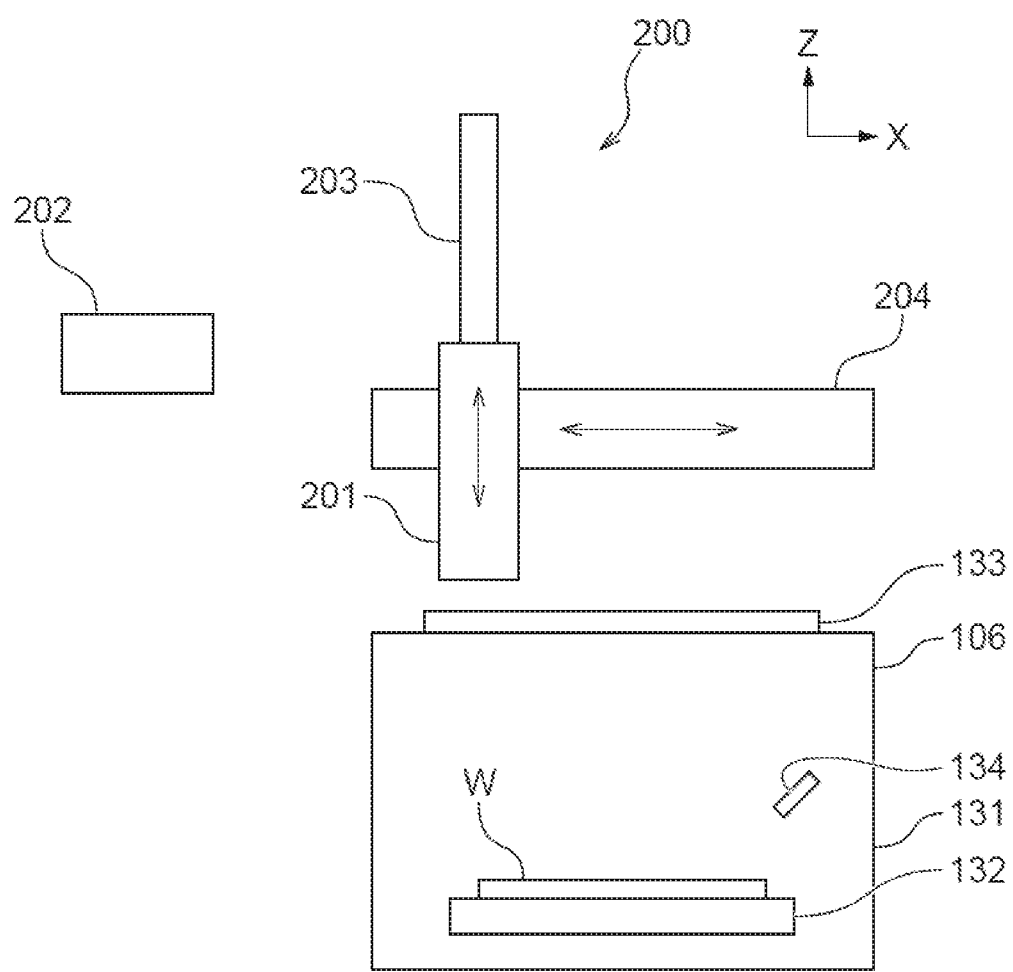
FIG. 2 is a schematic configuration diagram illustrating a bump height measurement device according to one embodiment.

FIG. 2 is a schematic configuration diagram illustrating the bump height measurement device according to one embodiment. The bump height measurement device 200 is provided in the dryer 106. This embodiment describes an example where the dryer 106 is a spin rinse dryer. The dryer 106 may, however, be any dryer such as a spin dryer having only the drying function.

As shown in FIG. 2, the dryer 106 includes a housing 131, a substrate rotation mechanism 132 placed in the housing 131, and a nozzle 134 placed above or in the vicinity of the substrate rotation mechanism 132. The housing 131 is provided with a shutter 133 configured to shield an inner space of the housing 131 from outside. The shutter 133 is operable and is configured to shield the inner space of the housing 131 from outside and to open the inner space. The substrate rotation mechanism 132 is configured to mount and hold the substrate W on a mounting surface thereof and rotate the substrate W. The nozzle 134 is configured to supply a cleaning liquid and/or pure water to the substrate W held on the substrate rotation mechanism 132. In the dryer 106, w % bile the substrate W is rotated by the substrate rotation mechanism 132, the substrate W is cleaned with the cleaning liquid and/or pure water supplied from the nozzle 134. After a stop of the supply of the cleaning liquid and/or pure water from the nozzle 134, the substrate W is rotated at a high speed to be dried by the substrate rotation mechanism 132.

The description herein shows the case where the bump height inspection device 200 is placed outside of the housing 131 of the dryer 106. Part or the entirety of the bump height inspection device 200 may, however, be placed inside of the housing 131 of the dryer 106. In the latter case, it is preferable to separate a space where the bump height inspection device 200 is placed, from a dry process module that performs the drying process, by the shutter 133. The bump height inspection device 200 may be placed either inside or outside of the dryer 106 and may be attached to or not attached to the dryer 106. The only requirement is that the bump height inspection device 200 is arranged to allow for inspection for the substrate placed in the dryer 106.

The bump height measurement device 200 includes a light sensor 201 and a controller 202 of the light sensor 201. The light sensor 201 and the controller 202 constitute a three-dimensional displacement meter. The three-dimensional displacement meter according to the embodiment is a device of measuring the distance to an object by the white light interferometry as described above. K-G5000 series, WI-0101 manufactured by KEYENCE CORPORATION may be used as one example of the three-dimensional displacement meter. The bump height measurement device 200 also includes a Z-axis robot 203 and an X-axis robot 204 configured to move the light sensor 201 in a vertical direction (Z-axis direction in FIG. 2) and in a horizontal direction (X-axis direction in FIG. 2). The Z-axis robot 203 is one example of a vertical direction moving mechanism, and the X-axis robot 204 is one example of a horizontal direction moving mechanism. The Z-axis robot 203 and the X-axis robot 204 are controlled by the controller 202 and/or the control device 120.

The control device 120 and/or the controller 202 configure the control device of the bump height measurement device 200. The control device 120 executes a program that controls the processing by the bump height inspection 200 and thereby controls the respective components of the bump height measurement device 200 via the controller 202 and/or not via the controller 202.

The light sensor 201 is a sensor head of the three-dimensional displacement meter. The light sensor 201 includes a laser light source, a beam splitter, a reference mirror, and a light-receiving element, which are not illustrated. Light emitted from the laser light source of the light sensor 201 is split by the beam splitter to irradiate the surface of the substrate W and to be reflected from the reference mirror in the light sensor 201. The light reflected from the surface of the substrate W and the light reflected from the reference mirror enter the light-receiving element in the light sensor 201 as interfering light. Height data on the substrate surface is measured or calculated, based on the intensity of the interfering light. For example, a reference plane (reference height) is set on a substrate surface, and height data on the substrate surface is measured or calculated as a difference in height relative to the reference plane. In the example of FIG. 8 and FIG. 9, height data of the bump 303 is obtained with setting the surface of the seed layer 301 under the resist layer 302 as the reference height. The light sensor 201 is attached to the Z-axis robot 203 shown in FIG. 2. The Z-axis robot 203 is attached to the X-axis robot 204. This configuration enables the light sensor 201 to be moved in the Z-axis direction and to be moved in the X-axis direction.

The shutter 133 shields/opens between inside and outside of the housing 131. The shutter 133 is opened before or after the substrate W is cleaned and dried inside of the housing 131, and the bump height on the substrate W is measured and inspected by the bump height measurement device 200. In the course of cleaning and drying the substrate W, the shutter 133 shields between inside and outside of the housing 131 to protect the bump height measurement device 200 from the cleaning liquid or the like and not to affect the cleaning and drying process.

Figure 3:
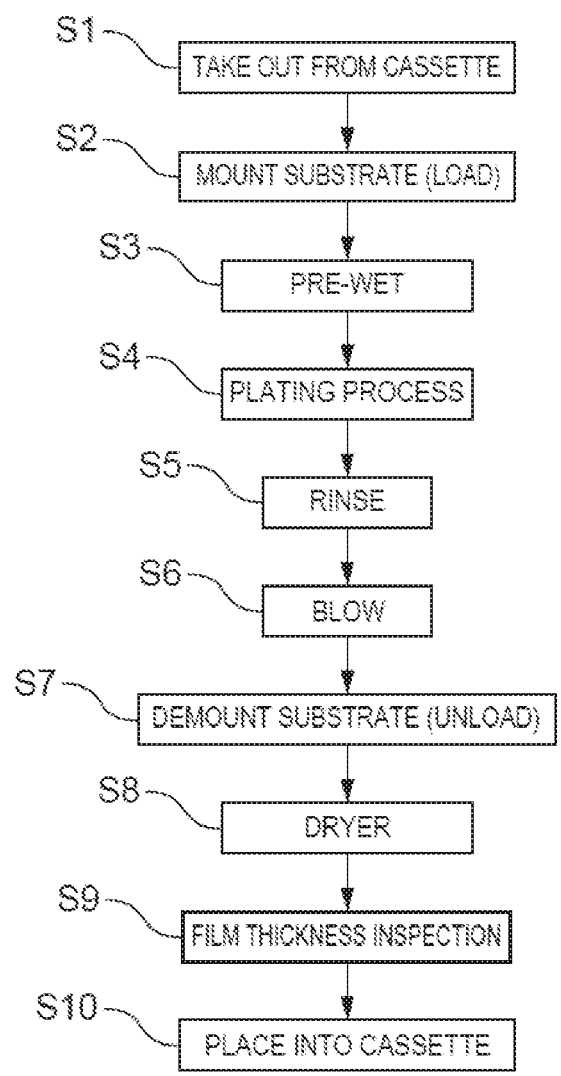
FIG. 3 shows a general flow of a process in the substrate processing apparatus.

FIG. 3 shows a general flow of a process in the substrate processing apparatus. This process is performed by the control device 120 and the controller 202. This process may be performed in cooperation with another computer and/or controller.

At step S1, the substrate W is taken out from a cassette on the cassette table 102 and is transferred and carried into the substrate mounting/demounting device 105a of the substrate mounting/demounting module 105 by the transfer robot 103a. At step S2, the substrate W is mounted to the substrate holder 11 by the substrate mounting/demounting device 105a. At step S3, the substrate holder 11 transferred and carried into the pre-wet module 108 by the substrate holder transfer device 113 is soaked in pure water. The substrate holder 11 is subsequently transferred and carried into one of the plating cells 112a of the plating process module 112, and a plating process is performed for the substrate W held by the substrate holder 11 to form the bump on the substrate (step S4). After the plating process, the substrate holder 11 is transferred and carried into the rinse module 110 by the substrate holder transfer device 113, and the substrate W is cleaned along with the substrate holder 11 by using a cleaning liquid (step S5). The substrate holder 11 after cleaning is transferred and carried into the blow module 109 by the substrate holder transfer device 113, and the liquid is drained from the substrate after cleaning (step S6). The substrate holder 11 is subsequently transferred and carried into the substrate mounting/demounting device 105a of the substrate mounting/demounting module 105 by the substrate holder transfer device 113, and the substrate W is demounted from the substrate holder 11 (step S7). The substrate W demounted from the substrate holder 11 is transferred and carried into the dryer 106 by the transfer robot 103a, and the substrate W is cleaned and dried in the dryer 106 (step S8). In the dryer 106, a bump height inspection process is performed for the substrate W (step S9). The bump height inspection process (S9) may be performed either before or after the cleaning and drying process (S8). After the processing in the dryer 106, the substrate W is returned into the cassette by the transfer robot 103a (step S10).

Figure 4:
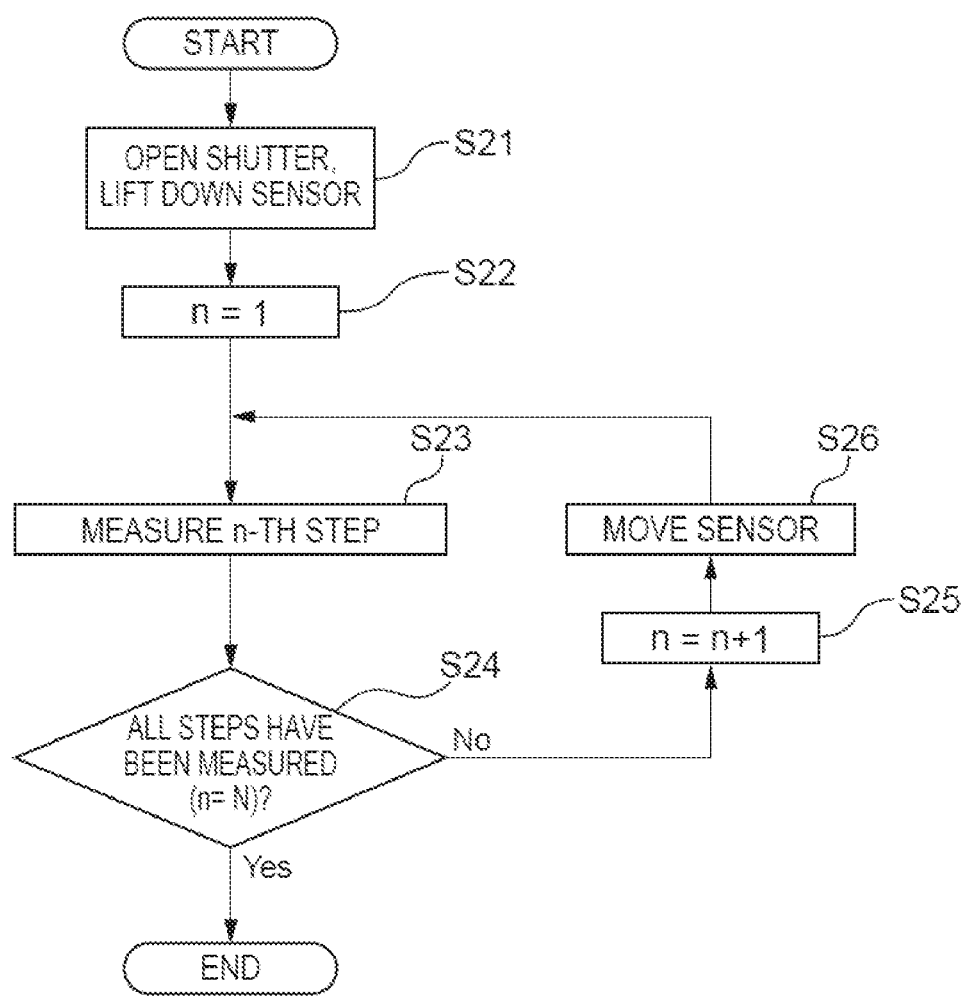
FIG. 4 is a flowchart showing a measurement phase process in a bump height inspection process.

FIG. 4 is a flowchart showing a measurement phase process in the bump height inspection process performed at step S9.

Figure 10:
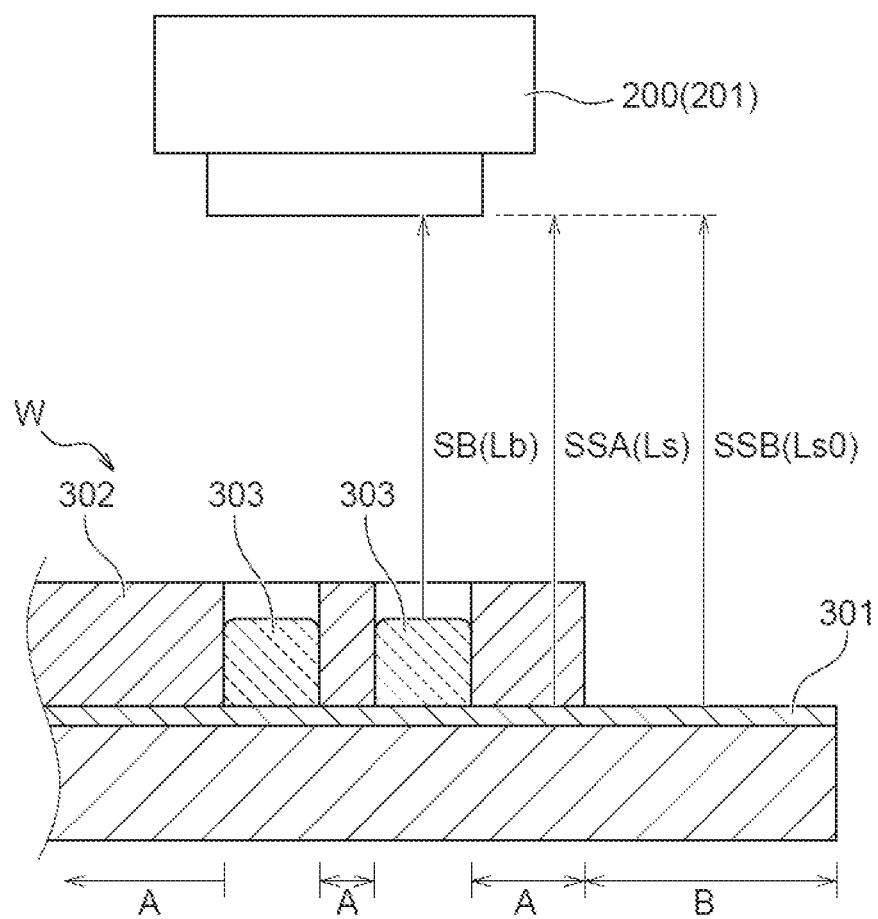
FIG. 10 illustrates a measurement principle of the bump height according to another embodiment.

At step S21, the shutter 133 is opened, and the light sensor 201 is lifted down into the housing 131 of the dryer 106 by the Z-axis robot 203 such as to be located within a predetermined distance range from the substrate W and is moved by the X-axis robot 204 to be adjusted to an initial position of Step-1 on the substrate W (shown in FIG. 10).

At step S22, a counter n specifying a Step to be measured is set to an initial value 1.

At step S23, while the substrate W is rotated by the substrate rotation mechanism 132, the bump height measurement device 200 successively measures the heights of the respective measurement areas 400 in a track corresponding to the current step on the substrate W. The measured height data (shown in FIG. 9) are transferred from the controller 202 to the control device 120. The control device 120 uses the height data and performs inspection for the bump height. Instead of rotating the substrate by the substrate rotation mechanism 132, for example, the light sensor 201 may be attached to the Z-axis robot 203 via a sensor rotation mechanism (not shown), and the sensor rotation mechanism may rotate the light sensor 201 along the circumferential direction of the substrate.

At step S24, it is determined whether all Steps have been measured by determining whether n=N. N represents the number of all the set Steps, and N=5 in the example of FIG. 12.

When n is smaller than N at step S24, the count n is incremented (step S25). The light sensor 201 is moved to a next step by the X-axis robot 204 at step S26, and the process then returns to step S23. The series of processing of steps S23 to S26 is then repeated until n becomes equal to N at step 24. When n becomes equal to N at step S24, the bump height measurement process is terminated.

Figure 5:
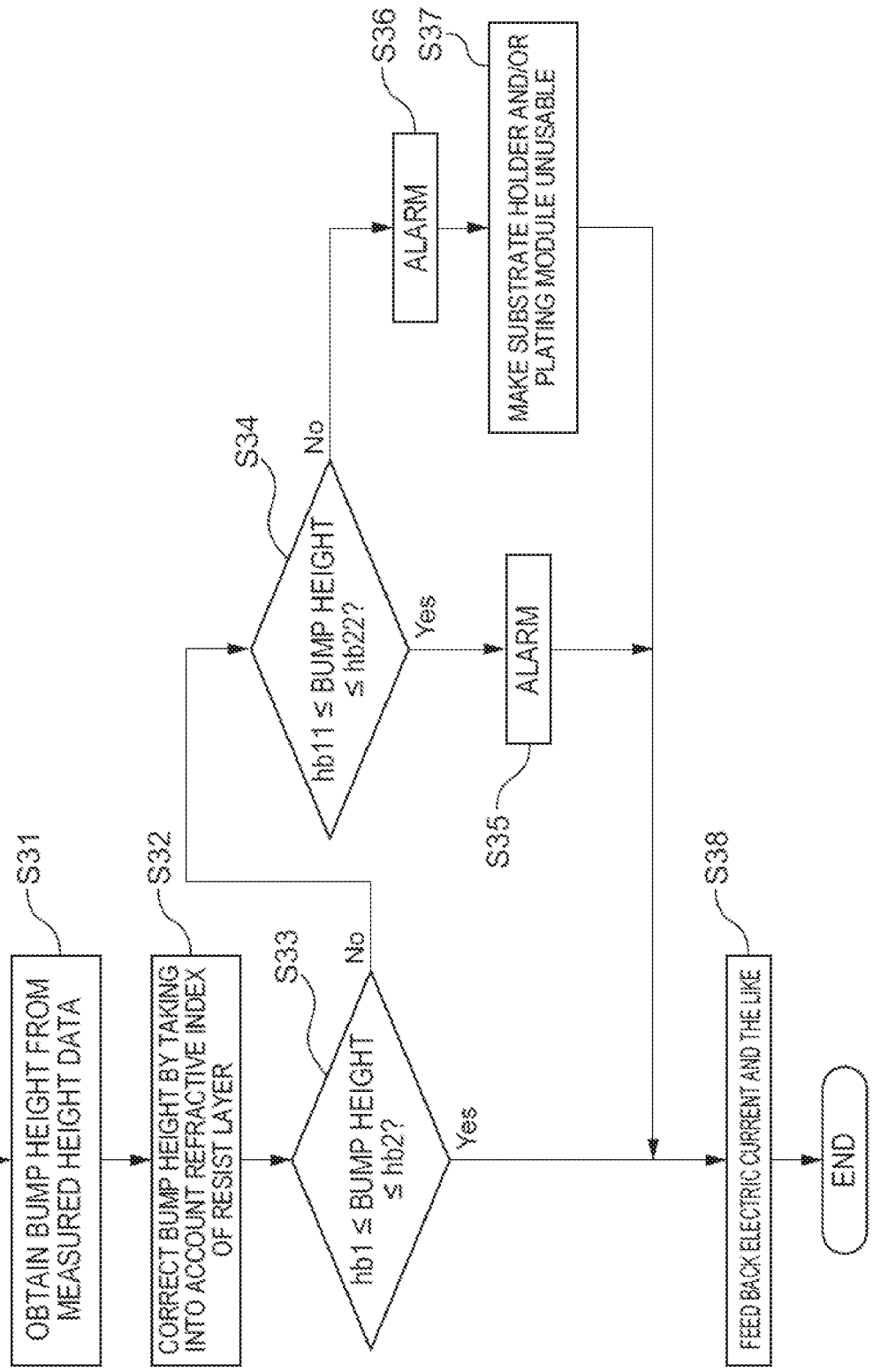
FIG. 5 is a flowchart showing an inspection phase process in the bump height inspection process.

FIG. 5 is a flowchart showing an inspection phase process in the bump height inspection process performed at step S9. The processing of FIG. 5 is performed with regard to all the measured height data after the measurement of the height data for all the tracks (Step 1 to Step 5 shown in FIG. 12) (after the affirmative answer YES is given at step S24).

At step S31, the height hb of each bump 303 is calculated or obtained from the height data (shown in FIG. 9) of the seed layer 301 (under the resist layer 302) and of the bumps 303 measured by the light sensor 201. The processing of step S31 is performed by the control device 120 or by the controller 202. The processing of and after step S32 is performed by the control device 120.

At step S32, the height hb of each bump 303 is corrected by taking into account the refractive index nr of the resist layer 302. One exemplified procedure obtains the height hr and the refractive index nr of the resist layer 302 from the recipe data and corrects the height hb of each bump 303 by Expression (2) to calculate a corrected bump height hb':

$$hb'=hb-(nr-1)hr \quad (2)$$

At step S33, it is determined whether the height hb' of each bump is within a normal height range (not less than the lower limit value hb1 and not greater than the upper limit value hb2).

When it is determined at step S33 that the height hb' of each bump is within the normal height range, the process proceeds to step S38. At step S38, data such as the plating current used for the plating process of the substrate W are fed back to a plating process control program or the like in the control device 120. The inspection phase process is then terminated.

When it is determined at step S33 that there is any bump having the bump height hb' out of the normal height range, the process proceeds to step S34.

At step S34, it is determined whether the height hb' of each bump determined to be not within the normal height range is within a range of equal to or higher than a second lower limit value hb11 (<lower limit value hb1) and equal to or lower than a second upper limit value hb22 (>upper limit value hb2). The second lower limit value hb11 and the second upper limit value hb22 are values used to set an alarm range that is out of the normal height range but is not such a significant error level as to make the substrate holder and/or the plating module unusable, and are set to values close the lower limit value hb1 and the upper limit value hb2.

When it is determined at step S34 that the height hb' of each bump determined to be not within the normal height range is within the range of equal to or higher than the second lower limit value hb11 and equal to or lower than the second upper limit value hbb2 (in the alarm range) (alarm determination), the process generates an alarm at step S35 and then proceeds to step S38. The inspection phase process then performs the processing of step S38 and is subsequently terminated.

When it is determined at step S34 that the height hb' of each bump determined to be not within the normal height range is out of the range of equal to or higher than the second lower limit value hb11 and equal to or lower than the second upper limit value hbb2 (out of the alarm range) (unusable determination), the process generates an alarm (S36) and makes the substrate holder 11 and/or the plating cells 112a that were used for the processing of the substrate W, unusable (step S37). The inspection phase process then performs the processing of step S38 and is subsequently terminated. The plating process of the substrate that is currently being plated by using the substrate holder and/or the plating module as the subject of unusable determination is continued, and the substrate holder and/or the plating module are made unusable after completion of the processing of the substrate. A modified procedure may make the substrate holder and/or the plating module unusable when the bump height sequentially has an abnormality corresponding to the unusable determination multiple times. In other words, the substrate holder and/or the plating module as the subject of unusable determination may be continuously used until the unusable determination is sequentially made multiple times. When the bump height is determined normal in the measurement after the processing of a next substrate, the alarm determination or the unusable determination may be cancelled for the substrate holder and/or the plating module having the alarm determination or the unusable determination. Another available procedure may stop a plating device and perform the maintenance after completion of the plating process of all the substrates currently placed in the plating process module 112. That is, the bump height inspection is performed for the substrate, and even when the substrate holder and/or the plating module have the alarm determination or the unusable determination as a result of the inspection, it may be determined whether an alarm is actually to be generated or whether the substrate holder and/or the plating module are actually to be made unusable, according to predetermined conditions.

In the description hereof, for convenience of explanation, the determination that generates an alarm (S35 in FIG. 5) is referred to as alarm determination (L), and the determination that generates an alarm and makes the substrate holder and/or the plating module unusable (S36 and S37 in FIG. 5) is referred to as unusable determination (LL). The abnormalities of the bump height include an abnormality of higher than the upper limit value hb2 and an abnormality of lower than the lower limit value hb1. In the viewpoint of the simplified description, the "alarm determination" and the "unusable determination" are respectively expressed as L and LL. The same applies to the description below. More specifically, the alarm determination is made to generate an alarm for encouraging the maintenance of the substrate holder and/or the plating module. The unusable determination is made to generate the alarm and/or to make the substrate holder and/or the plating module unusable. The inspection and the determination are performed for the substrate. The result of the determination is related to the substrate holder and/or the plating module that were used for the processing of the substrate, as processing information or a processing record of the substrate, into a plating apparatus (for example, a control device or a memory readable by the control device, or the like). The processing based on the result of the determination (for example, generation of an alarm or a process of making the substrate holder and/or the plating module unusable) is performed with regard to the substrate holder and/or the plating module that were used for the processing of the substrate. In one example, the control device determines whether the processing described above is to be performed, based on the result of the determination, and performs the above processing when it is determined that a predetermined condition is satisfied. The determination with regard to the substrate such as the alarm determination or the unusable determination may lead to an alarm generated for the substrate holder and/or the plating module that were used for the processing of the substrate or lead to a process of making the substrate holder and/or the plating module unusable. It may thus be regarded that the determination such as the alarm determination or the unusable determination or related evaluation is made for the substrate holder and/or the processing module that were used for the processing of the substrate. In other words, performing the inspection and determination with regard to the substrate may be regarded as making the determination or the evaluation with regard to the substrate holder and/or the processing module that were used for the processing of the substrate.

Every time the measurement for one or a plurality of tracks (Step 1 to Step 5) is completed, the processing of step S31 to step S38 may be performed for all the height data measured with regard to the track(s). Every time the measurement for one or a plurality of measurement areas 400 is completed, the processing of steps S31 to S38 may be performed for the height data measured with regard to the measurement area(s).

Another Embodiment

Figure 11:
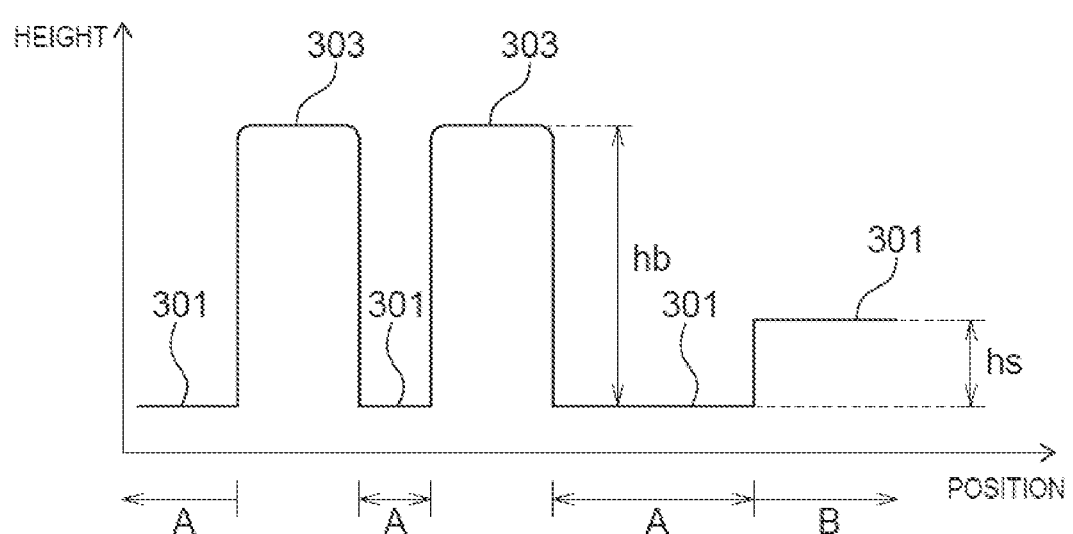
FIG. 11 illustrates a measurement example based on the measurement principle of the bump height according to another embodiment.

FIG. 10 illustrates a measurement principle of the bump height according to another embodiment. FIG. 11 illustrates a measurement example based on the measurement principle of the bump height according to another embodiment.

According to this embodiment, as shown in FIG. 11, the bump height measurement device 200 specifies the surface of the seed layer 301 in an area that is covered with the resist layer 302 (area A shown in FIG. 10) as a reference plane (reference height), measures a height hb of each bump 303 and a height hs of the seed layer 301 in an exposed area that is not covered with the resist layer 302 (area B shown in FIG. 10), and calculates or obtains the height of the bump 303 by hb−hs. In the case where a substrate surface is irradiated with light emitted from the light sensor 201 of the bump height measurement device 200, reflected lights respectively reflected from the bump 303, from the seed layer 301 in the area A and from the seed layer 301 in the area B are respectively expressed as reflected lights SB, SSA and SSB. Measuring an optical path difference (Ls−Lb) between an optical path length (Ls) to the seed layer 301 in the area A and an optical path length (Lb) to the bump 303, based on the reflected light SSA and the reflected light SB, results in calculating or measuring the height hb of the bump 303 relative to the seed layer 301 in the area A as the reference plane as shown in FIG. 11. Measuring an optical path length (Ls−Ls0) between the optical path length (Ls) to the seed layer 301 in the area A and an optical path length (Ls0) to the seed layer 301 in the area B, based on the reflected light SSA and the reflected light SSB, results in calculating or measuring the height hs of the seed layer 301 in the area B relative to the seed layer 301 in the area A as the reference plane as shown in FIG. 11.

The area B that is the exposed area of the seed layer 301 is present in an outer circumferential area of the substrate W. This area B is an area that is sealed in the substrate holder 11 when the substrate W is held by the substrate holder 11 and that is brought into contact with the contact for power feed. This area B is not exposed to or not brought into contact with the plating solution and has the seed layer exposed even after the plating process.

As described above, the resist layer 302 has the refractive index nr that is larger than the refractive index n0 in the air. The film thickness of the resist layer 302 measured with the light from the light sensor 201 accordingly has an apparent distance (optical path length) that is larger than the film thickness in the air. In other words, the seed layer 301 in the area A covered with the resist layer 302 is measured to be farther away from the light sensor 201, compared with the seed layer 301 in the exposed area. Accordingly, as shown in FIG. 11, there is an optical path difference hs between the optical path length Ls to the seed layer 301 in the area A and the optical path length Ls0 to the seed layer 301 in the area B, which are measured based on the reflected light SSA and the reflected light SSB.

The height of the bump 303 that is to be actually measured is calculated or obtained by subtracting the height hs (optical path difference) of the seed layer 301 in the area B relative to the seed layer 301 in the area A as the reference plane from the height hb (optical path difference) of the bump 303 relative to the seed layer 301 in the area A as the reference plane (hb−hs).

According to this embodiment, in the measurement process of FIG. 4, the bump height measurement device 200 specifies the seed layer 301 in the area A as the reference plane, calculates or measures the height hb of the bump 303 and the height hs of the seed layer 301 in the area B, and obtains the height data of the substrate surface as shown in FIG. 11. An inspection phase process of FIG. 6 is subsequently performed.

Figure 6:
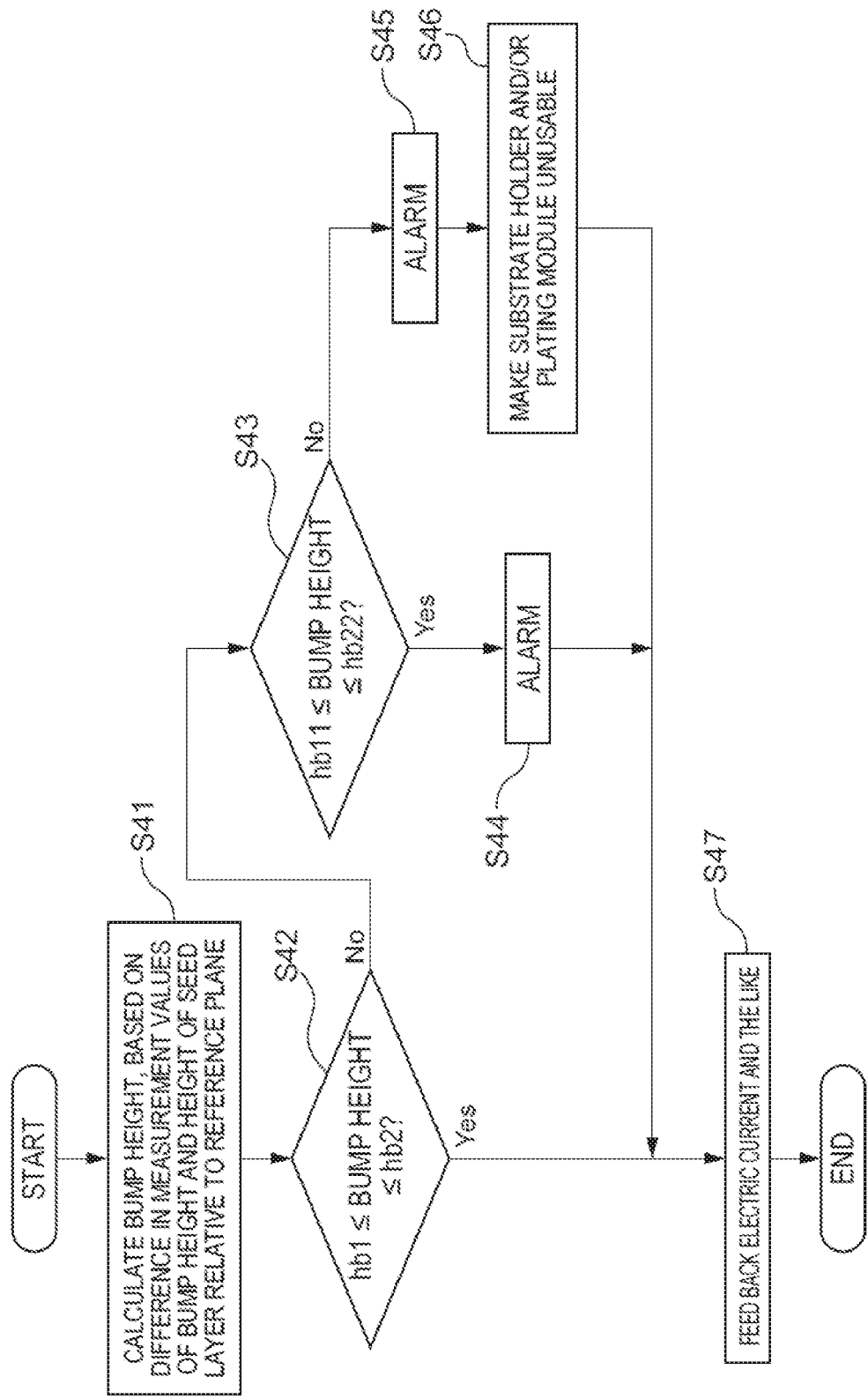
FIG. 6 is a flowchart showing the inspection phase process in the bump height inspection process according to another embodiment.

FIG. 6 is a flowchart showing the inspection phase process in the bump height inspection process according to another embodiment.

At step S41, the height of each bump 303 is calculated or obtained from the height data of the substrate surface (shown in FIG. 11) according to Expression (3) given below.

$$hb' = hb - hs \quad (3)$$

In this Expression, hb represents a measurement value of the height of the bump 303 relative to the seed layer 301 in the area A as the reference plane, and hs represents a measurement value of the height of the seed layer 301 in the area B relative to the seed layer 301 in the area A as the reference plane. The processing of steps S42 to S47 is subsequently performed. The processing of steps S42 to S47 is identical with the processing of steps S33 to S38 shown in FIG. 5, and the description thereof is omitted.

Like the processing of steps S33 to S38 of FIG. 5, the processing of FIG. 6 is performed with regard to all the measured height data after the measurement of the height data for all the tracks (Step 1 to Step 5 shown in FIG. 12) (after the affirmative answer YES is given at step S24). Every time the measurement for one or a plurality of tracks (Step 1 to Step 5) is completed, the processing of step S42 to step S47 may be performed for all the height data measured with regard to the track(s). Every time the measurement for one or a plurality of measurement areas 400 is completed, the processing of steps S42 to S47 may be performed for the height data measured with regard to the measurement area(s).

In the determination process in the inspection phase processes shown in the flowcharts of FIG. 5 and FIG. 6, when there is even one bump having the unusable determination (LL), the process may make the determination with regard to the substrate as the unusable determination (LL) and actually make the substrate holder and/or the plating module that were used for the processing of the substrate, unusable. When a predetermined or greater number of or a predetermined or higher ratio of the bumps have the unusable determination (LL), the process may make the determination with regard to the substrate as the unusable determination (LL) and actually make the substrate holder and/or the plating module that were used for the processing of the substrate, unusable. Similarly, when there is even one bump having the alarm determination (L), the process may make the determination with regard to the substrate as the alarm determination (L) and actually generate an alarm. When a predetermined or greater number of or a predetermined or higher ratio of the bumps have the alarm determination (L), the process may make the determination with regard to the substrate as the alarm determination (L) and actually generate an alarm.

(Determination with Regard to Measurement Area)

The determination process in the inspection phase processes shown in the flowcharts of FIG. 5 and FIG. 6 may be performed with regard to each measurement area 400. For example, the process determines a maximum value hb'max and a minimum value hb'mini among the heights of one or a plurality of bumps included in a measurement area that is an object of determination (calculated at S31 and S32 in FIG. 5 or at S41 in FIG. 6). When the maximum value hb'max and the minimum value hb'mini are in a range of equal to or higher the lower limit value hb1 and equal to or lower than the upper limit value hb2 (in a normal range), the determination with regard to this measurement area 400 is made as normal (S33 to S38 in FIG. 5 or S42 to S47 in FIG. 6). When the maximum value hb'max and the minimum value hb'mini are not within the range of equal to or higher the lower limit value hb1 and equal to or lower than the upper limit value hb2 but are within a range of equal to or higher than the second lower limit value hb11 and equal to or lower than the second upper limit value hb22 (in an alarm range), the determination with regard to this measurement area 400 is made as the alarm determination (L) (S34 to S35 in FIG. 5 or S43 to S44 in FIG. 6). When it is determined that the maximum value hb'max and the minimum value hb'mini are lower than the second lower limit value hb11 or higher than the second upper limit value hb22, the determination with regard to this measurement area 400 is made as the unusable determination (LL) (S36-S37 in FIG. 5 or S45 to S46 in FIG. 6).

The determination of the bump height described above may be made with regard to each measurement area 400. When there is even one measurement area 400 having the unusable determination (LL), the process may make the determination with regard to the substrate as the unusable determination (LL) and actually make the substrate holder and/or the plating module that were used for the processing of the substrate, unusable. When a predetermined or greater number of or a predetermined or higher ratio of the measurement areas 400 have the unusable determination (LL), the process may make the determination with regard to the substrate as the unusable determination (LL) and actually make the substrate holder and/or the plating module that were used for the processing of the substrate, unusable. Similarly, when there is even one measurement area 400 having the alarm determination (L), the process may make the determination with regard to the substrate as the alarm determination (L) and actually generate an alarm. When a predetermined or greater number of or a predetermined or higher ratio of the measurement areas 400 have the alarm determination (L), the process may make the determination with regard to the substrate as the alarm determination (L) and actually generate an alarm.

The determination with regard to each measurement area and/or the determination using the maximum value and the minimum value in the measurement area enhance the accuracy of evaluation of the bump height in the substrate even when the measurement value of the light sensor has a measurement noise due to, for example, the fact that the light reflected by the bump is not sufficiently returned to the sensor according to the shape and the properties of a bump end. For example, this configuration reduces the risk of wrong detection as the alarm determination or as the unusable determination due to the measurement noise of the light sensor.

(Filtering)

Figure 13:
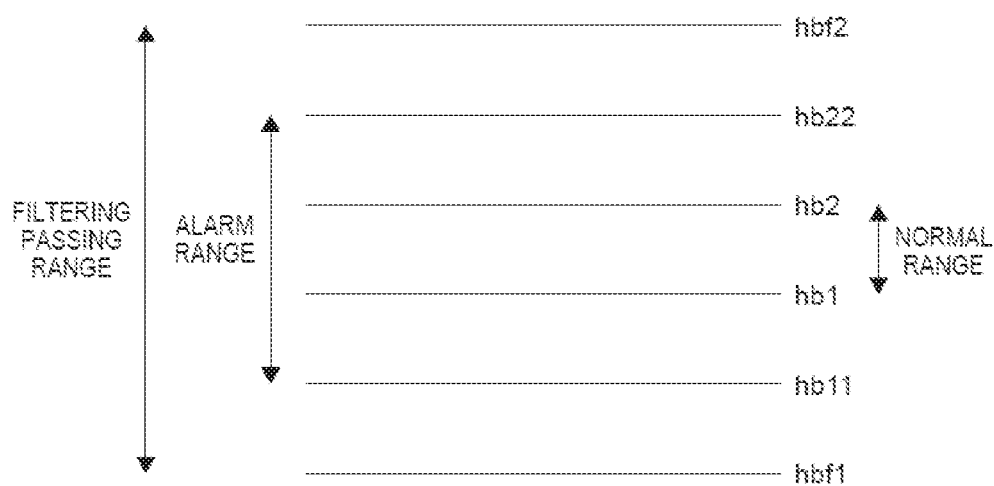
FIG. 13 is an explanatory diagram illustrating a filtering range of measurement results.

Prior to the determination process in the inspection phase processes shown in the flowcharts of FIG. 5 and FIG. 6 (including the case of determination with regard to each measurement area) and a determination process described below, a filtering process may be performed to exclude the values of the bump height exceeding a predetermined numerical value range (not less than hbf1 and not greater than hbf2) from the object of the determination process, among the measurement values of the bump height. A filtering passing range (not less than hbf1 and not greater than hbf2) is an area exceeding an alarm range (not less than hb11 and not greater than hb22) as shown in FIG. 13. The numerical value range of the filtering process is set such as to cut the noise from the object of the determination process, among the measurement results of the bump height. For example, in some cases, the measurement value of the light sensor is likely to have a measurement noise due to, for example, the fact that the light reflected by the bump is not sufficiently returned to the sensor according to the shape and the properties of a bump end. The numerical value range of the filtering process is set such as to prevent such a measurement noise, or more specifically an abnormal measurement value that is improbable as the result of plating, from being referred to in the determination process. Making the determination using the value of the bump height after this filtering process enhances the accuracy of the determination.

Determination Example 1

With a view to further reducing the influence of the measurement noise of the light sensor on the determination result, the determination of the bump height in each measurement area 400 may be made by taking into account the measurement results with regard to a plurality of measurement areas 400. One exemplified procedure may specify the results of determination of the bump height made with regard to the respective measurement areas 400 described above, as tentative determination results, and may settle a final determination with regard to an object measurement area 400, based on the tentative determination result of the object measurement area 400 and the tentative determination results of one or a plurality of measurement areas 400 adjacent to or close to the object measurement area 400. For example, the number of measurement areas used for the final determination (the number of adjacent or close measurement areas including the object measurement area as the object of the final determination) is expressed as N(E), and a threshold value used for the final determination is expressed as NN(E). The procedure checks the tentative determination results of the number N(E) of the adjacent or close measurement areas 400 including the object measurement area 400 as the object of the final determination. For example, when the number of the measurement areas 400 having the unusable determination (LL) as the tentative determination results is equal to or greater than the value NN(E), the procedure makes the final determination with regard to the object measurement area 400 as the unusable determination (LL). When the number of the measurement areas 400 having either the unusable determination (LL) or the alarm determination (L) as the tentative determination results is equal to or greater than the value NN(E), the procedure makes the final determination with regard to the object measurement area 400 as the alarm determination (L).

Figure 14:
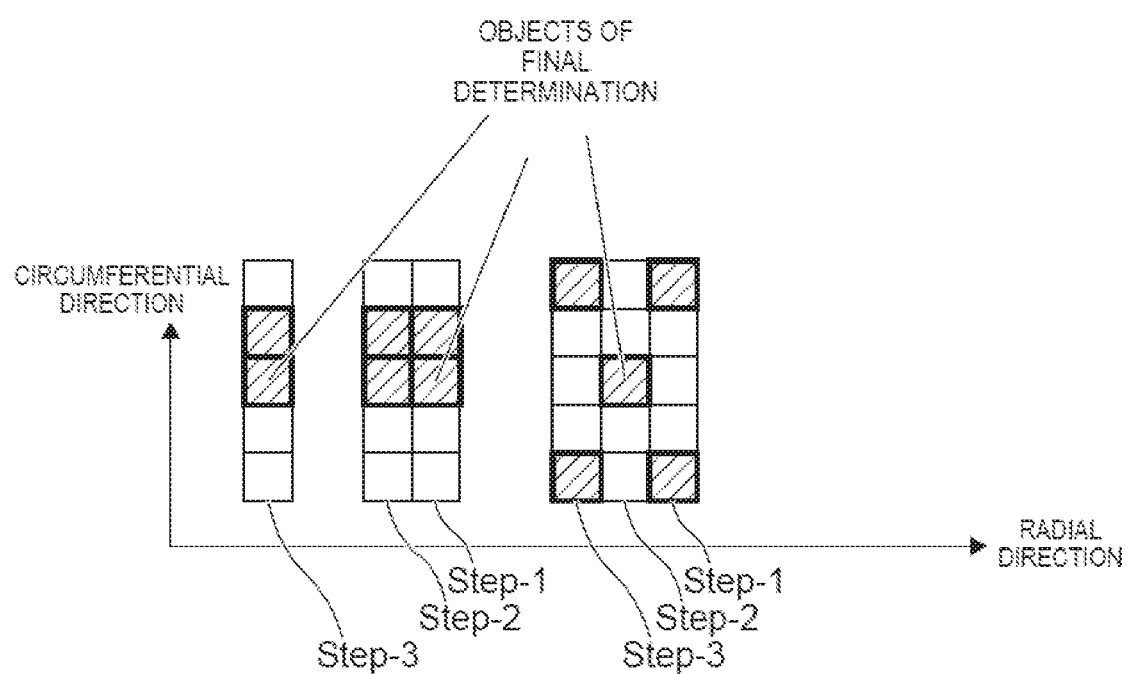
FIG. 14 illustrates an example of a measurement areas used for final determination.

FIG. 14 illustrates an example of the measurement areas used for the final determination. As shown in this diagram, a plurality of measurement areas 400 used for the final determination include, for example, an object measurement area 400 and measurement areas adjacent to or close to the object measurement area 400 in a radial direction and/or a circumferential direction (a direction crossing Steps and a direction along Steps) of the substrate. The plurality of measurement areas 400 used for the final determination may be successive measurement areas 400 or may be discrete measurement areas 400. In another example, the plurality of measurement areas 400 used for the final determination may be regularly or randomly selected measurement areas 400 (in an identical step or in different steps) including the object measurement area 400 as the object of the final determination. In the case of omitting the measurement of the bump height with regard to part of Steps and/or part of the measurement areas, the plurality of measurement areas 400 used for the final determination are measurement areas adjacent to or close to the object measurement area 400 in the radial direction and/or in the circumferential direction of the substrate, the successive measurement areas 400, the discrete measurement areas 400, the regularly or randomly selected measurement areas 400 or the like, among the actually measured measurement areas.

Figure 15:
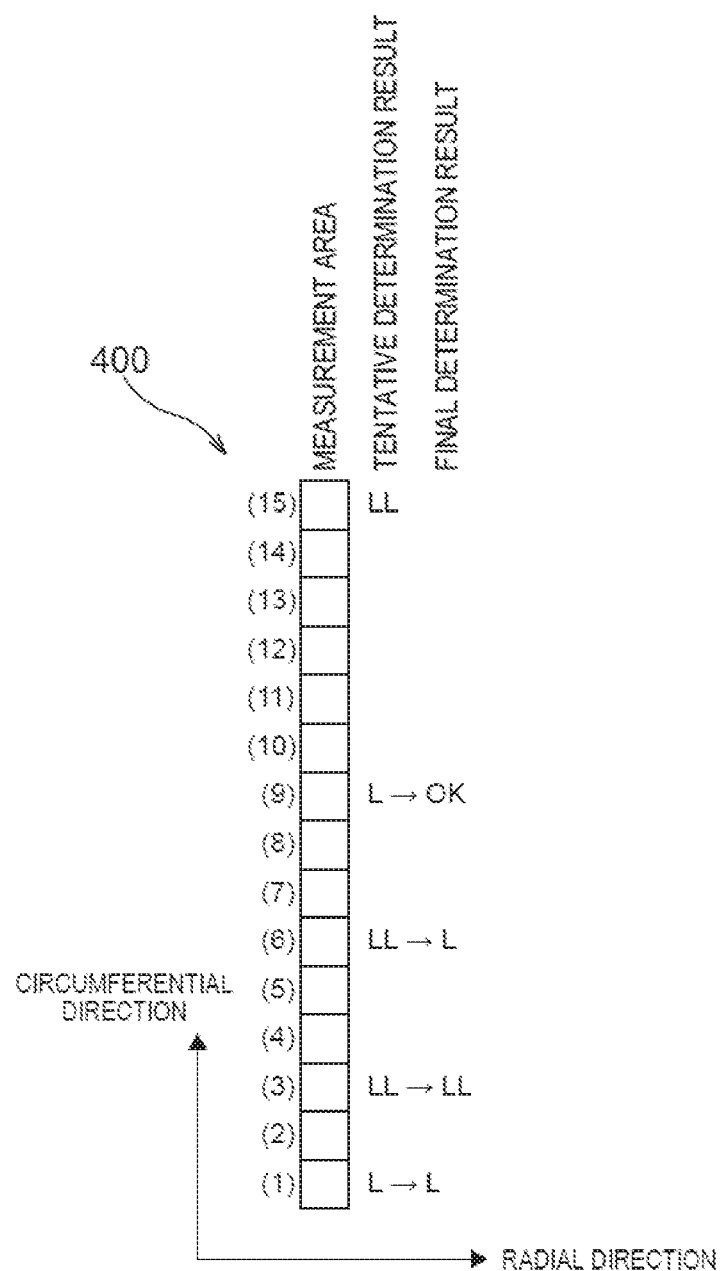
FIG. 15 is an explanatory diagram illustrating one exemplified process of making the final determination with regard to each measurement area, based on tentative determination results of a plurality of measurement areas.

FIG. 15 is an explanatory diagram illustrating one exemplified process of making the final determination with regard to each measurement area, based on the tentative determination results of a plurality of measurement areas. This diagram illustrates a plurality of measurement areas 400 in a specific step. Numerals (1) to (15) are assigned for the purpose of discriminating the respective measurement areas. The tentative determination results and the final determination results are expressed as the alarm determination (L) or the unusable determination (LL) on the side of the respective measurement areas. The measurement areas without any representation L or LL are regarded as normal. In this example, N(E)=5, and NN(E)=2. When the number of the measurement areas 400 having the unusable determination (LL) as the tentative determination results is equal to or greater than two, the final determination with regard to the object measurement area 400 is made as the unusable determination (LL). When the number of the measurement areas 400 having either the unusable determination (LL) or the alarm determination (L) as the tentative determination results is equal to or greater than two, the final determination with regard to the object measurement area 400 is made as the alarm determination (L).

In this diagram, in the case of making the final determination with regard to the measurement area (1), the N(E) =five adjacent measurement areas including the object measurement area (1) are the measurement areas (1) to (5). Among the measurement areas (1) to (5), the number of the measurement areas having the tentative determination result LL is one, and the total number of the measurement areas having the tentative determination result LL or L is two. As a result, the final determination with regard to the measurement area (1) is made as the alarm determination (L).

In the case of making the final determination with regard to the measurement area (3), the five adjacent measurement areas including the object measurement area (3) are the measurement areas (3) to (7). Among the measurement areas (3) to (7), the number of the measurement areas having the tentative determination result LL is two. As a result, the final determination with regard to the measurement area (3) is made as the unusable determination (LL).

In the case of making the final determination with regard to the measurement area (9), the five adjacent measurement areas including the object measurement area (9) are the measurement areas (9) to (13). Among the measurement areas (9) to (13), the number of the measurement areas having the tentative determination result LL is zero, and the total number of the measurement areas having the tentative determination result LL or L is one. As a result, the final determination with regard to the measurement area (9) is made as normal.

With regard to the measurement area having the tentative determination result as normal, the final determination is not made by using the tentative determination results of a plurality of measurement areas, but the tentative determination result (normal) is specified as the final determination result. In another example, even with regard to the measurement area having the tentative determination result as normal, the final determination may be made by using the tentative determination results of adjacent or close measurement areas.

In the example described above, the subsequent measurement areas after the object measurement area are selected as the measurement areas used for the final determination. Both the preceding and subsequent measurement areas before and after the object measurement area or the preceding measurement areas may be selected instead.

The following describes processes of making a final determination with reference to flowcharts in the case where the final determination is made after the tentative determination results of the respective measurement areas are obtained and in the case where the final determination is made in parallel to measurement with regard to the respective measurement areas.

Figure 16:
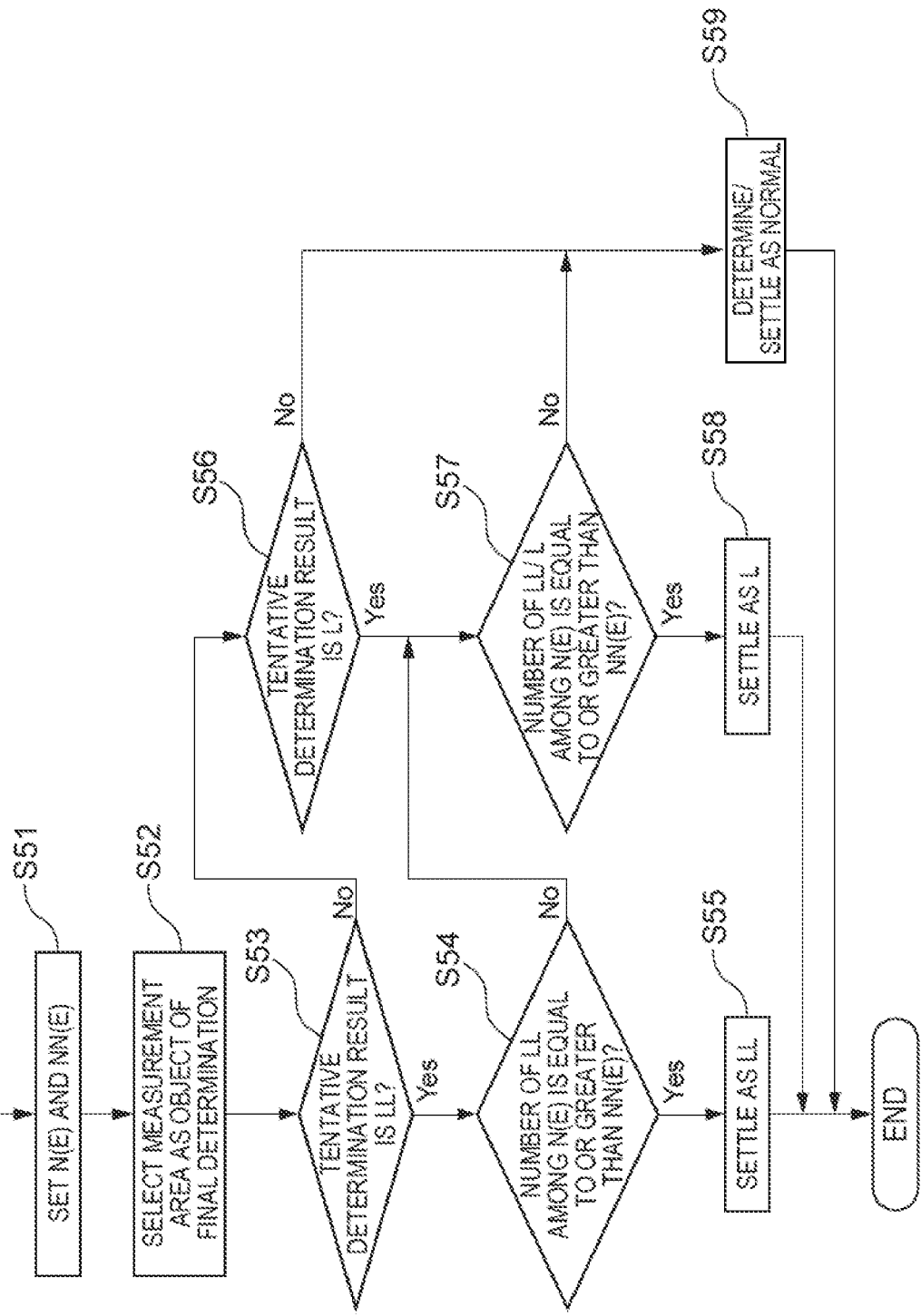
FIG. 16 is a flowchart showing a process of making the final determination with regard to each measurement area, based on the tentative determination results of a plurality of measurement areas.

FIG. 16 is a flowchart showing a process of making the final determination with regard to each measurement area, based on the tentative determination results of a plurality of measurement areas. This process is performed after the tentative determination results of the respective measurement areas are obtained.

At S51, the process sets the number N(E) of the measurement areas used for the final determination and the threshold value NN(E) used for the final determination.

At S52, the process selects an object measurement area 400 as the object of final determination.

At S53, the process determines whether the tentative determination result of the object measurement area 400 is the unusable determination (LL). When the tentative determination result of the object measurement area 400 is the unusable determination (LL), the process proceeds to S54.

At S54, the process determines whether the number of the measurement areas 400 having the unusable determination (LL) among the adjacent or close N(E) measurement areas 400 including the object measurement area 400 is equal to or greater than NN(E) by taking into account the tentative determination results of the N(E) measurement areas 400. When the number of the measurement areas 400 having the unusable determination (LL) among the N(E) measurement areas 400 is equal to or greater than NN(E), the process makes the final determination with regard to the object measurement area 400 as the unusable determination (LL) (S55).

When the number of the measurement areas 400 having the unusable determination (LL) among the N(E) measurement areas 400 is not equal to or greater than NN(E) at S54, the process proceeds to S57.

At S57, the process determines whether the total number of the measurement areas 400 having the unusable determination (LL) or the alarm determination (L) as the tentative determination result is equal to or greater than NN(E) by taking into account the tentative determination results of the adjacent or close N(E) measurement areas 400 including the object measurement area 400. When the total number of the measurement areas 400 having the unusable determination (LL) or the alarm determination (L) as the tentative determination result among the N(E) measurement areas 400 is equal to or greater than NN(E), the process makes the final determination with regard to the object measurement area 400 as the alarm determination (L) (S58).

When the total number of the measurement areas 400 having the unusable determination (LL) or the alarm determination (L) as the tentative determination result among the N(E) measurement areas is not equal to or greater than NN(E) at S57, the process makes the final determination with regard to the object measurement area 400 as normal (S59).

Accordingly, even when the tentative determination result of the object measurement area 400 is the unusable determination (LL) at S53, this process settles the unusable determination (LL) as the final determination result of the object measurement area 400 or changes the final determination result of the object measurement area 400 to the alarm determination (L) or to normal by taking into account the tentative determination results of the adjacent or close N(E) measurement areas 400 including the object measurement area 400.

When the tentative determination result of the object measurement area 400 is not the unusable determination (LL) at S53, the process proceeds to S56.

At S56, the process determines whether the tentative determination result of the object measurement area 400 is the alarm determination (L). When the tentative determination result of the object measurement area 400 is the alarm determination (L), the process proceeds to S57.

At S57, the process determines whether the total number of the measurement areas 400 having the unusable determination (LL) or the alarm determination (L) as the tentative determination result is equal to or greater than NN(E) by taking into account the tentative determination results of the adjacent or close N(E) measurement areas 400 including the object measurement area 400. When the total number of the measurement areas 400 having the unusable determination (LL) or the alarm determination (L) as the tentative determination result among the N(E) measurement areas 400 is equal to or greater than NN(E), the process makes the final determination with regard to the object measurement area 400 as the alarm determination (L) (S58). When the total number of the measurement areas 400 having the unusable determination (LL) or the alarm determination (L) as the tentative determination result among the N(E) measurement areas is not equal to or greater than NN(E), on the other hand, the process makes the final determination with regard to the object measurement area 400 as normal (S59).

Accordingly, even when the tentative determination result of the object measurement area 400 is the alarm determination (L) at S56, this process settles the alarm determination (L) as the final determination result of the object measurement area 400 or changes the final determination result of the object measurement area 400 to normal by taking into account the tentative determination results of the adjacent or close N(E) measurement areas 400 including the object measurement area 400.

When the tentative determination result of the object measurement area 400 is not the alarm determination (L) at S56, the process makes the final determination with regard to the object measurement area 400 as normal (S59). Accordingly, when the tentative determination result of the object measurement area 400 is normal, this process settles normal as the final determination result of the object measurement area 400 (S59) without taking into account the tentative determination results of the adjacent or close N(E) measurement areas 400 including the object measurement area 400. Even when the tentative determination result of the object measurement area 400 is normal, however, the final determination may be made by taking into account the tentative determination results of a plurality of measurement areas 400.

The process subsequently changes the object measurement area to a next measurement area (S52) and repeats the processing of and after S53.

In the above description, NN(E) is the same value at S54 and S57. NN(E) may, however, be different values at S54 and S57.

The foregoing describes the case of performing the process of final determination after the measurement of the bump height and the process of tentative determination with regard to all the areas as the measurement objects of the substrate W (the measurement areas 400 in Step 1 to Step 5). A modification may perform the process of tentative determination and final determination, in parallel to measurement of the respective measurement areas 400. One exemplified procedure may perform the process of tentative determination after every measurement of one or a plurality of measurement areas 400 and may perform the process of final determination after every calculation of the tentative determination results of the measurement areas 400 required for final determination with regard to one or a plurality of groups. Another exemplified procedure may perform the process of tentative determination in parallel to measurement of the respective measurement areas 400 and may perform the process of final determination after the measurement of the bump height and the tentative determination process with regard to all the measurement areas.

Figure 17:
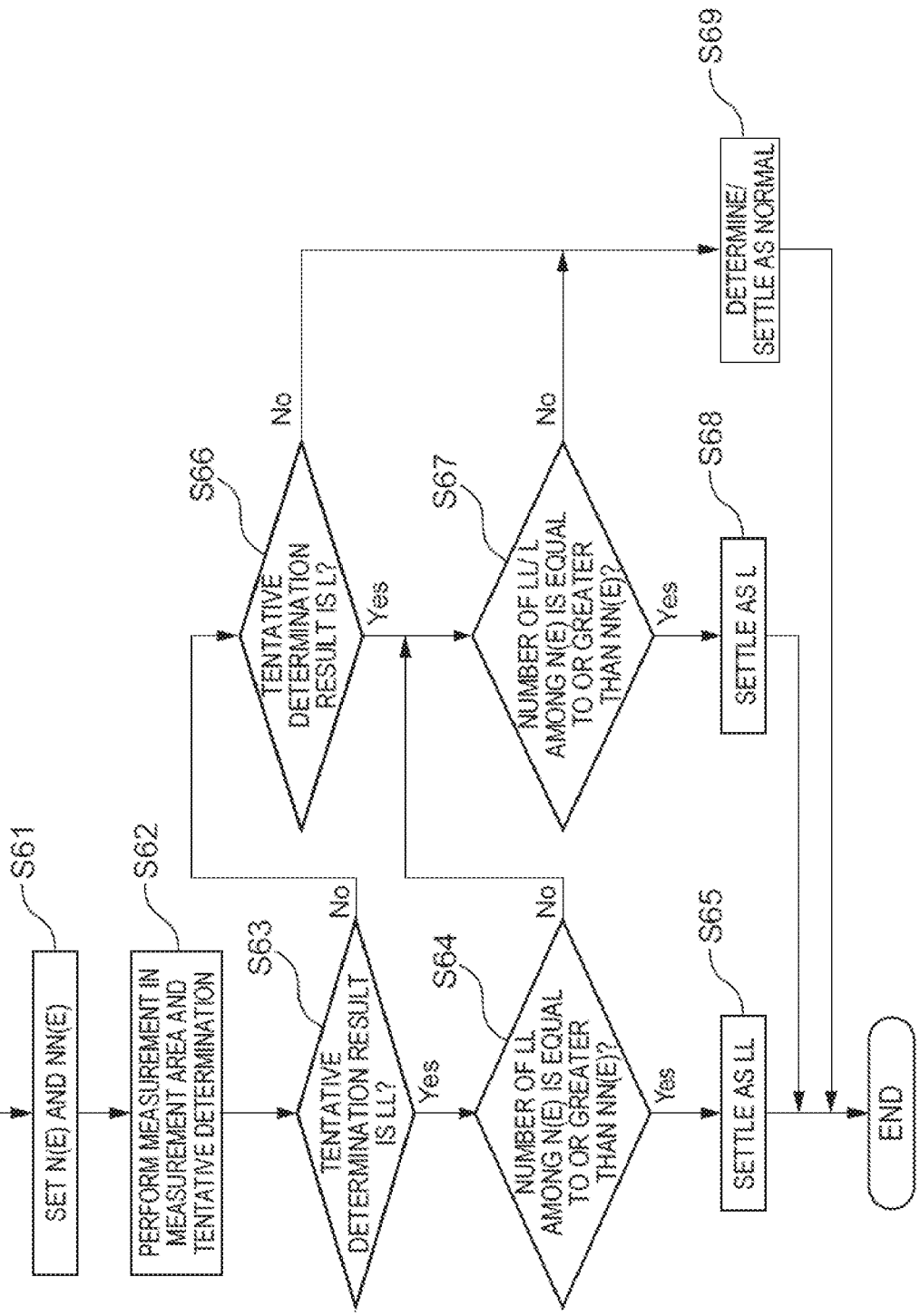
FIG. 17 is a flowchart showing another example of the process of making the final determination with regard to each measurement area, based on the tentative determination results of a plurality of measurement areas.

FIG. 17 is a flowchart showing another example of the process of making the final determination with regard to each measurement area, based on the tentative determination results of a plurality of measurement areas. In the process of this example, the tentative determination process and the final determination process are performed with regard to each measurement area, in parallel to measurement of the respective measurement areas by the bump height measurement device 200.

At S61, the process sets the number N(E) of the measurement areas used for the final determination and the threshold value NN(E) used for the final determination.

At S62, the process measures the bump height in each measurement area 400 and performs tentative determination. While each measurement area 400 is measured, the tentative determination is sequentially made with regard to the measurement area 400 for which the bump height data is obtained. The process of final determination is performed at and after S63.

At S63, the process determines whether the tentative determination result of a measurement area 400 that is an object of final determination is the unusable determination (LL). When the tentative determination result of the measured measurement area 400 is the unusable determination (LL), the process sets a tentative flag in the measurement area 400, sets adjacent or close N(E) measurement areas 400 including the measurement area 400, and proceeds to S64.

At S64, when the tentative determination results of the set N(E) measurement areas 400 are obtained by subsequent measurement, the process determines whether the number of the measurement areas 400 having the unusable determination (LL) among the N(E) measurement areas 400 is equal to or greater than NN(E). When the number of the measurement areas 400 having the unusable determination (LL) among the N(E) measurement areas 400 is equal to or greater than NN(E), the process makes the final determination with regard to the measurement area 400 that is the object of final determination as the unusable determination (LL) and cancels the tentative flag (S65).

When the number of the measurement areas 400 having the unusable determination (LL) among the N(E) measurement areas 400 is not equal to or greater than NN(E) at S64, the process proceeds to S67.

At S67, the process determines whether the total number of the measurement areas 400 having either the unusable determination (LL) or the alarm determination (L) as the tentative determination result among the N(E) measurement areas 400 is equal to or greater than NN(E). When the total number of the measurement areas 400 having either the unusable determination (LL) or the alarm determination (L) as the tentative determination result among the N(E) measurement areas 400 is equal to or greater than NN(E), the process makes the final determination with regard to the measurement area 400 that is the object of final determination as the alarm determination (L) and cancels the tentative flag (S68).

When the total number of the measurement areas 400 having either the unusable determination (LL) or the alarm determination (L) as the tentative determination result among the N(E) measurement areas 400 is not equal to or greater than NN(E) at S67, the process makes the final determination with regard to the measurement area 400 that is the object of final determination, as normal (S69).

When the tentative determination result of the measured measurement area 400 that is the object of final determination is not the unusable determination (LL) at S63, the process proceeds to S66.

At S66, the process determines whether the tentative determination result of the measurement area 400 that is the object of final determination is the alarm determination (L). When the tentative determination result of the measured measurement area 400 is the alarm determination (L), the process sets a tentative flag in the measurement area 400, sets adjacent or close N(E) measurement areas 400 including the measured measurement area 400, and proceeds to S67.

At S67, when the tentative determination results of the set N(E) measurement areas 400 are obtained by subsequent measurement, the process determines whether the total number of the measurement areas 400 having either the unusable determination (LL) or the alarm determination (L) as the tentative determination result among the N(E) measurement areas 400 is equal to or greater than NN(E). When the total number of the measurement areas 400 having either the unusable determination (LL) or the alarm determination (L) as the tentative determination result among the N(E) measurement areas 400 is equal to or greater than NN(E), the process makes the final determination with regard to the measurement area 400 that is the object of final determination as the alarm determination (L) and cancels the tentative flag (S68). When the total number of the measurement areas 400 having either the unusable determination (LL) or the alarm determination (L) as the tentative determination result among the N(E) measurement areas 400 is not equal to or greater than NN(E), on the other hand, the process makes the final determination with regard to the measurement area 400 that is the object of final determination, as normal (S69).

When the tentative determination result of the measurement area 400 that is the object of final determination is not the alarm determination (L) at S66, the process makes the final determination with regard to the measurement area 400 that is the object of final determination, as normal (S69). Accordingly, when the tentative determination result of the object measurement area 400 is normal, this process settles normal as the final determination result of the object measurement area 400 without taking into account the tentative determination results of the adjacent or close N(E) measurement areas 400 including the object measurement area 400. When the tentative determination result of the object measurement area 400 is either LL or L, on the other hand, this process sets the tentative flag in the object measurement area 400 and makes the final determination with regard to the measured object measurement area 400 by taking into account the tentative determination results of the adjacent or close N(E) measurement areas 400. Even when the tentative determination result of the object measurement area 400 is normal, however, the final determination may be made by taking into account the tentative determination results of a plurality of measurement areas 400.

The process described above performs the tentative determination with regard to each measurement area 400 every time the bump height data of the measurement area 400 is obtained. Every time the result of the tentative determination is LL or L with regard to a certain measurement area, the process sets the tentative flag in the certain measurement area, sets a plurality of measurement areas including the certain measurement area and performs final determination with regard to the certain measurement area, based on the tentative determination results of the plurality of measurement areas.

In the above description, NN(E) is the same value at S64 and S67. NN(E) may, however, be different values at S64 and S67.

In the processes of FIG. 16 and FIG. 17, the tentative determination and the final determination of the bump height may be performed with regard to each measurement area 400 as described above. When there is even one measurement area 400 having the unusable determination (LL) as the final determination, the process may make the determination with regard to the substrate as the unusable determination (LL) and actually make the substrate holder and/or the plating module that were used for the processing of the substrate, unusable (S37 in FIG. 5 and S46 in FIG. 6). When a predetermined or greater number of or a predetermined or higher ratio of the measurement areas 400 have the unusable determination (LL) as the final determination, the process may make the determination with regard to the substrate as the unusable determination (LL) and actually make the substrate holder and/or the plating module that were used for the processing of the substrate, unusable. Similarly, when there is even one measurement area 400 having the alarm determination (L) as the final determination, the process may make the determination with regard to the substrate as the alarm determination (L) and actually generate an alarm. When a predetermined or greater number of or a predetermined or higher ratio of the measurement areas 400 have the alarm determination (L) as the final determination, the process may make the determination with regard to the substrate as the alarm determination (L) and actually generate an alarm. Performing the final determination with regard to each measurement area based on the tentative determination results of a plurality of measurement areas 400 as described above prevents the determination result with regard to the substrate from being made as the alarm determination or as the unusable determination in the case where a measurement noise described above is generated only once.

Determination Example 2

Figure 18:
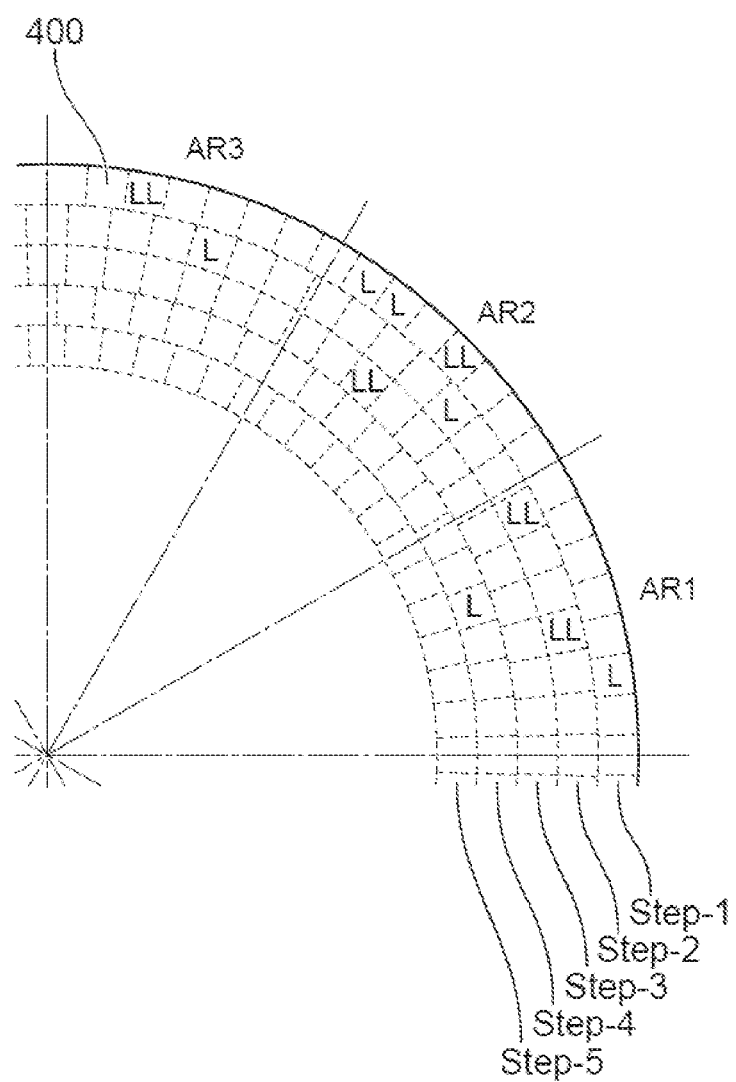
FIG. 18 is an explanatory diagram illustrating one exemplified process of performing determination with regard to each determination area in a substrate, based on determination results of a plurality of measurement areas in the determination area.

FIG. 18 is an explanatory diagram illustrating one exemplified process of performing determination with regard to each determination area in a substrate, based on determination results of a plurality of measurement areas in the determination area. The determination result of the measurement area may be the tentative determination result or the final determination result described above. The determination area is an area including one or a plurality of measurement areas. The determination area may be an area obtained by dividing the substrate W by every predetermined rotation angle, may be an area obtained by dividing the substrate W by every identical or different lengths or areas, or may be an area obtained by dividing the substrate by any other method. This diagram illustrates determination areas AR1 to AR3 that are part of determination areas AR1 to AR12 obtained by dividing the substrate W by every rotation angle of 30 degrees. A plurality of measurement areas 400 in Step 1 to Step 5 are included in each of the determination areas. The representation of L or LL assigned to each measurement area 400 indicates the result of the tentative determination (or the final determination). The measurement areas 400 without the representation L or LL are regarded as normal. In this example, when the number of the measurement areas having LL is equal to or greater than N(LL) in one identical determination area and in one identical Step, the determination is made as the unusable determination (LL). When the total number of the measurement areas 400 having L or LL is equal to or greater than N(L/LL) in one identical determination area and in one identical Step, the determination with regard to the determination area is made as the alarm determination (L). As described above, the determination with regard to each determination area AR is performed by using the tentative determination results (or the final determination results) of the measurement areas 400 included in the determination area AR.

For example, it is assumed that N(L/LL)=N(LL)=2. With regard to the determination area AR1, there are two (>=N(LL)) measurement areas 400 having the determination result of LL in Step 2. Accordingly, the determination with regard to the determination area AR1 is made as LL (unusable determination). There is one (<N(L/LL)) measurement area 400 having the determination result of L in Step 1 and there is also one (<N(L/LL)) measurement area 400 having the determination result of L in Step 4. These, however, do not affect the determination with regard to the determination area AR1.

With regard to the determination area AR2, there are three (>=N(L/LL)) measurement areas 400 having the determination result of either L or LL in Step 1. The number of the measurement areas 400 having LL is, however, one (<N(LL)). Accordingly, the determination with regard to the determination area AR2 is made as L (alarm determination).

With regard to the determination area AR3, in any one identical Step, there are not the measurement areas having LL equal to or greater than N(LL) and there are not the measurement areas having either L or LL equal to or greater than N(L/LL). Accordingly, the determination area AR3 is determined as normal.

Figure 19:
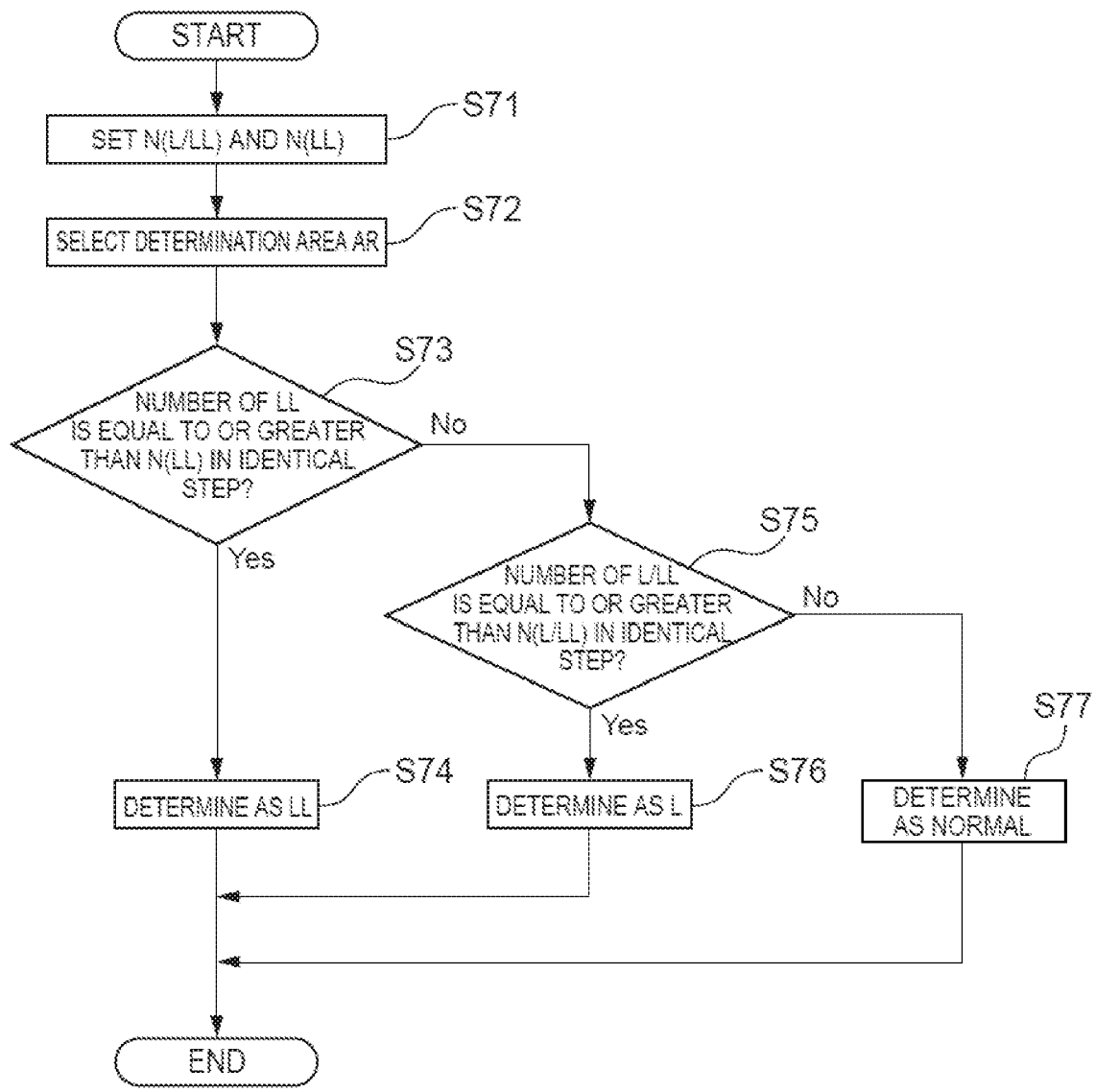
FIG. 19 is a flowchart showing one exemplified process of performing determination with regard to each determination area.

FIG. 19 is an explanatory diagram (flowchart) illustrating one exemplified process of performing determination with regard to each determination area of a substrate, based on the determination results of a plurality of measurement areas included in the determination area. This process is performed after the measurement of the bump height and the determination process of the measurement areas are performed with regard to all the areas that are the objects of measurement (i.e., the areas to be actually measured among the measurement areas 400 in Step 1 to Step 5).

At S71, the process sets a threshold value N(L/LL) used for making the alarm determination (L) and a threshold value N(LL) used for making the unusable determination (LL).

At S72, the process selects an object determination area AR that is an object of determination.

At S73, the process checks the determination results of the measurement areas 400 included in the object determination area AR and determines whether the number of the measurement areas 400 having the determination result of LL is equal to or greater than N(LL) with regard to each of Steps 1 to 5 in this determination area AR When there is any Step where the number of the measurement areas 400 having the determination result of LL is equal to or greater than N(LL), the process makes the determination with regard to this determination area AR as LL (unusable determination) (S74).

When there is no Step where the number of the measurement areas 400 having the determination result of LL is equal to or greater than N(LL) at S73, the process proceeds to S75. At S75, the process determines whether the number of the measurement areas 400 having the determination result of either L or LL is equal to or greater than N(L/LL) with regard to each Step in this determination area. When there is any Step where the number of the measurement areas 400 having the determination result of either L or LL is equal to or greater than N(L/LL), the process makes the determination with regard to this determination area AR as L (alarm determination) (S76).

When there is no Step where the number of the measurement areas 400 having the determination result of either L or LL is equal to or greater than N(L/LL) at S75, the process makes the determination with regard to this determination area AR as normal (S77).

The process subsequently changes the determination area (S72) and repeats the processing of and after S73.

This determination process described above sets a determination area that is wider than the measurement area and performs the evaluation for the entire determination area, based on the determination results of a plurality of measurement areas included in the determination area. This configuration further reduces the influence of the measurement noise. Furthermore, in the case of a failure occurring in the power feed electrode (contact), a similar influence is likely to occur in the bump height in an identical Step on the substrate or more specifically at an identical radial direction position (on a circumference of an identical diameter). This configuration performs the determination with regard to a determination area, based on the determination results of the measurement areas included in the identical determination area and at an identical radial direction position.

Determination Example 3

Figure 20:
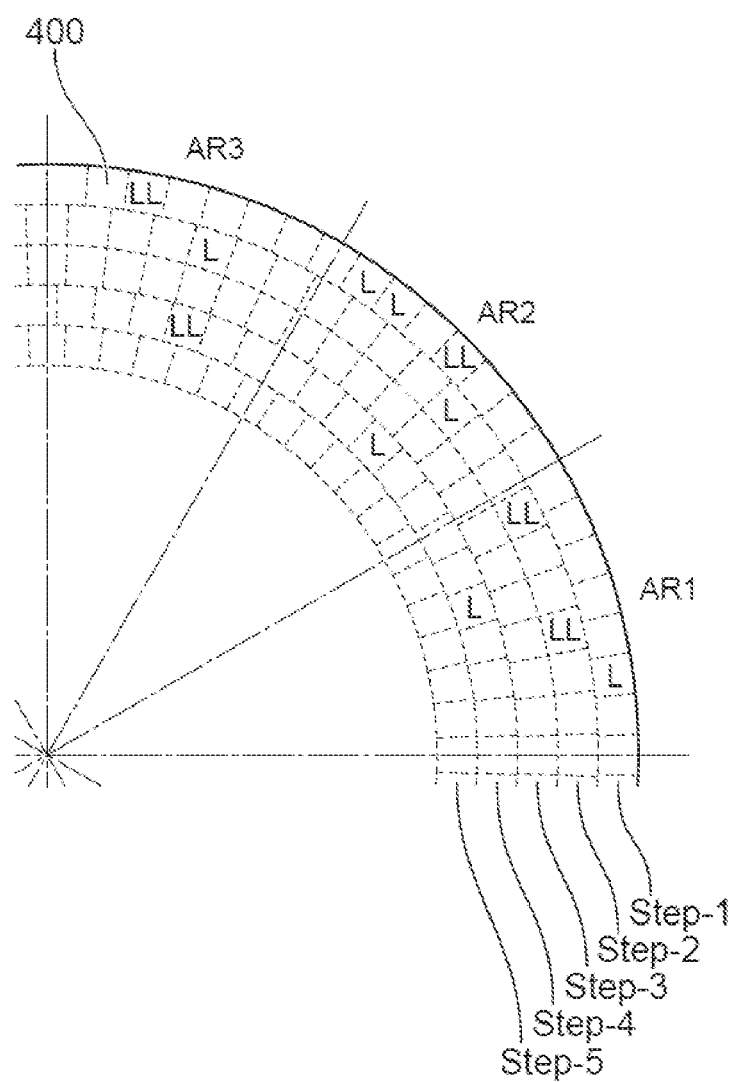
FIG. 20 is an explanatory diagram illustrating another exemplified process of performing determination with regard to each determination area in a substrate, based on determination results of a plurality of measurement areas in the determination area.

FIG. 20 is an explanatory diagram illustrating another exemplified process of performing determination with regard to each determination area in a substrate, based on determination results of a plurality of measurement areas in the determination area. The determination result of the measurement area may be the tentative determination result or the final determination result described above. In this example, a threshold value N(L/LL) used for making the alarm determination (L) and a threshold value N(LL) used for making the unusable determination (LL) are set. When the total number of the measurement areas 400 having L or LL is equal to or greater than N(L/LL) in one identical determination area, the determination with regard to the determination area is made as the alarm determination (L). When the total number of the measurement areas 400 having L or LL is smaller than N(L/LL) in one identical determination area, the determination area is determined as normal. When the total number of the measurement areas 400 having L or LL is equal to or greater than N(L/LL) and the number of the measurement areas 400 having LL is equal to or greater than N(LL) in one identical determination area, the determination with regard to the determination area is made as the unusable determination (LL).

In this example, it is assumed that N(L/LL)=4 and N(LL)=2. With regard to a determination area AR1, there are four (>N(L/LL)) measurement areas 400 having the determination result of L or LL in the identical determination area, so that the determination with regard to the determination area AR1 may be L (alarm determination). There are also two (>=N(LL)) measurement areas 400 having the determination result of LL. Accordingly, the determination with regard to the determination area AR1 is made as LL (unusable determination).

With regard to a determination area AR2, there are five (>=N(L/LL)) measurement areas 400 having the determination result of L or LL in the identical determination area, so that the determination with regard to the determination area AR2 may be L (alarm determination). There is also one (<N(LL)) measurement area 400 having the determination result of LL. Accordingly, the determination with regard to the determination area AR2 is made as L (alarm determination).

With regard to a determination area AR3, there are three (<N(L/LL)) measurement areas 400 having the determination result of L or LL in the identical determination area. Accordingly, the determination area AR3 is determined as normal. Even when the total number of the measurement areas 400 having the determination result of L or LL is smaller than N(L/LL) in one identical determination area, the determination with regard to the determination area may be made as LL (unusable determination) in the case where the number of the measurement areas 400 having the determination result of LL is equal to or greater than N(LL).

Figure 21:
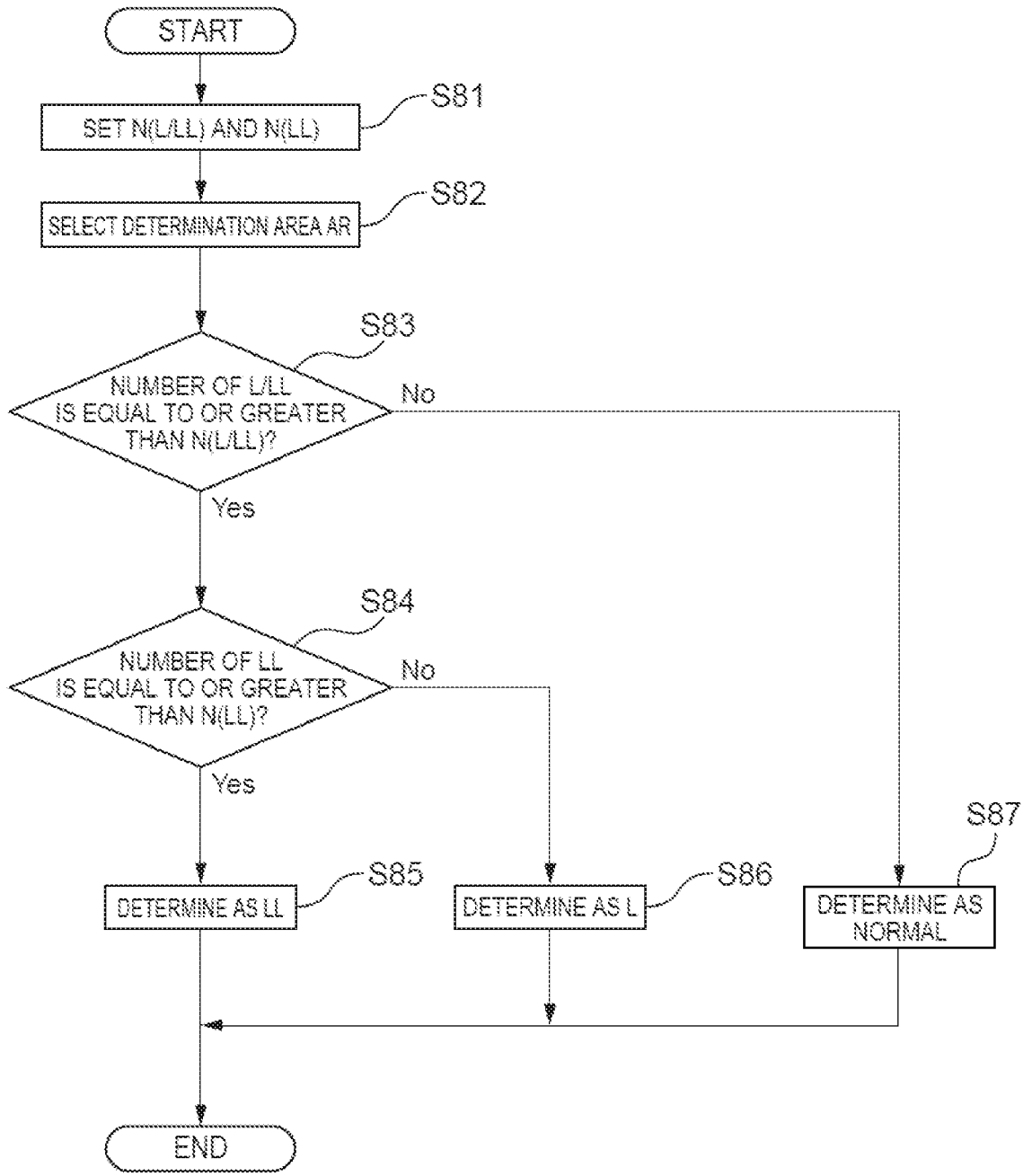
FIG. 21 is a flowchart showing another exemplified process of performing determination with regard to each determination area.

FIG. 21 is a flowchart showing another exemplified process of performing determination with regard to each determination area.

At S81, the process sets a threshold value N(L/LL) used for making the alarm determination (L) and a threshold value N(LL) used for making the unusable determination (LL).

At S82, the process selects an object determination area AR that is an object of determination.

At S83, the process checks the determination results of the measurement areas 400 included in the object determination area AR and determines whether the total number of the measurement areas 400 having the determination result of L or LL is equal to or greater than N(L/LL) in this determination area AR. When the total number of the measurement areas 400 having the determination result of L or LL is equal to or greater than N(L/LL), the process proceeds to step S84. When the total number of the measurement areas 400 having the determination result of L or LL is not equal to or greater than N(L/LL), on the other hand, the process determines this determination area AR as normal (S87).

At S84, the process determines whether the total number of the measurement areas 400 having the determination result of LL is equal to or greater than N(LL) in this determination area AR. When the total number of the measurement areas 400 having the determination result of LL is equal to or greater than N(LL), the process makes the determination with regard to this determination area AR as the unusable determination (LL) (S85).

When the total number of the measurement areas 400 having the determination result of LL is not equal to or greater than N(LL), on the other hand, the process makes the determination with regard to this determination area AR as the alarm determination (L) (S86).

The process subsequently changes the determination area (S82) and repeats the processing of and after S83.

This determination process described above sets a determination area that is wider than the measurement area and performs the evaluation for the entire determination area, based on the determination results of a plurality of measurement areas included in the determination area. This configuration further reduces the influence of the measurement noise. Furthermore, the determination is made, based on the measurement areas included in the entire identical determination area. This configuration simplifies the determination process, compared with the configuration of performing the determination with regard to each Step in an identical determination area.

In the determination examples 2 and 3, the determination is performed with regard to each determination area AR as described above. When there is even one determination area AR having the unusable determination (LL), the process may make the determination with regard to the substrate as the unusable determination (LL) and actually generate an alarm and make the substrate holder and/or the plating module that were used for the processing of the substrate, unusable. When a predetermined or greater number of or a predetermined or higher ratio of the determination areas AR have the unusable determination (LL), the process may make the determination with regard to the substrate as the unusable determination (LL) and actually generate and alarm and make the substrate holder and/or the plating module that were used for the processing of the substrate, unusable. Similarly, when there is even one determination area AR having the alarm determination (L), the process may make the determination with regard to the substrate as the alarm determination (L) and actually generate an alarm. When a predetermined or greater number of or a predetermined or higher ratio of the determination areas AR have the alarm determination (L), the process may make the determination with regard to the substrate as the alarm determination (L) and actually generate an alarm.

The foregoing describes the configuration that performs the measurement of the bump height with regard to all the areas of the substrate W that are the objects to be measured (the areas to be actually measured among the measurement areas 400 in Step 1 to Step 5) and the determination process of the measurement area and subsequently performs the determination process of the determination area. A modified configuration may perform the determination process of the measurement area and the determination process of the determination area in parallel to the measurement of each measurement area 400. For example, a modified procedure may perform the determination process of the determination area every time the measurement of one or a plurality of measurement areas 400 is performed and may perform the determination process of the determination area every time the determination results of the measurement areas 400 required for the determination process of one or a plurality of determination areas are calculated. Another modified procedure may perform the determination process of the measurement area in parallel to the measurement of each measurement area 400 and may perform the determination process of the determination area after the measurement of the bump height with regard to all the measurement areas and the determination process of the measurement area. Another modified procedure may appropriately perform the tentative determination process of the measurement area, the final determination process of the measurement area and/or the determination process of the determination area, in parallel to the measurement of the bump height with regard to each measurement area.

There are various possible reasons for the abnormality of the bump height. The abnormality of the bump height is more likely to occur concentratively in a specific area on the substrate rather than occurring sporadically on the substrate. The determination example 2 and the determination example 3 are configured to perform the determination with regard to each determination area as a divisional area on the substrate, based on the determination results of a plurality of measurement areas included in the determination area. This configuration enables the appropriate determination to be performed without being excessively affected by the sporadic measurement noises.

(Cancellation of Abnormality Determination Process)

Figure 22:
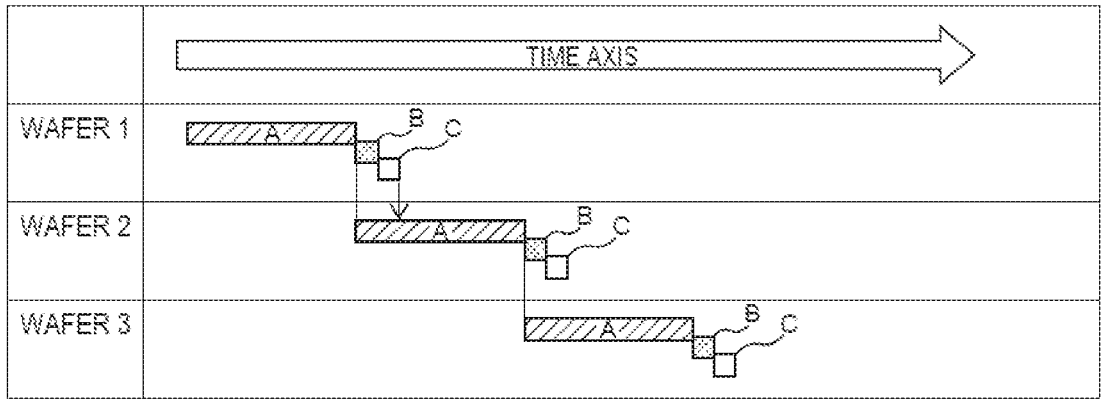
FIG. 22 is a time chart of substrate processing.
Figure 23:
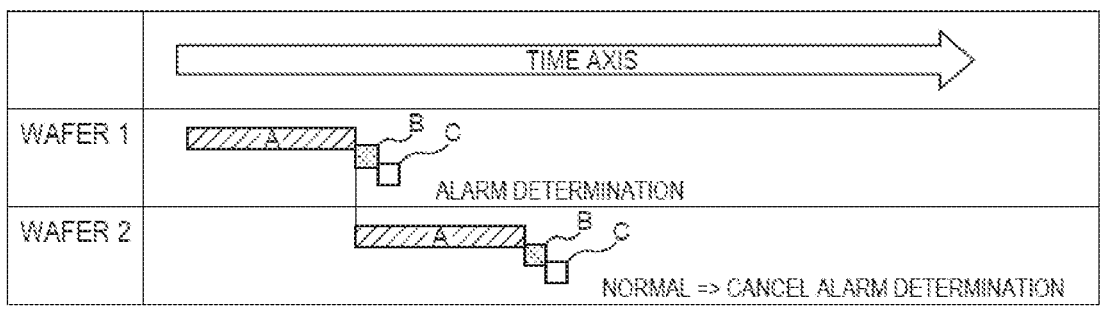
FIG. 23 is a time chart of the substrate processing to describe cancellation of alarm.
Figure 24:
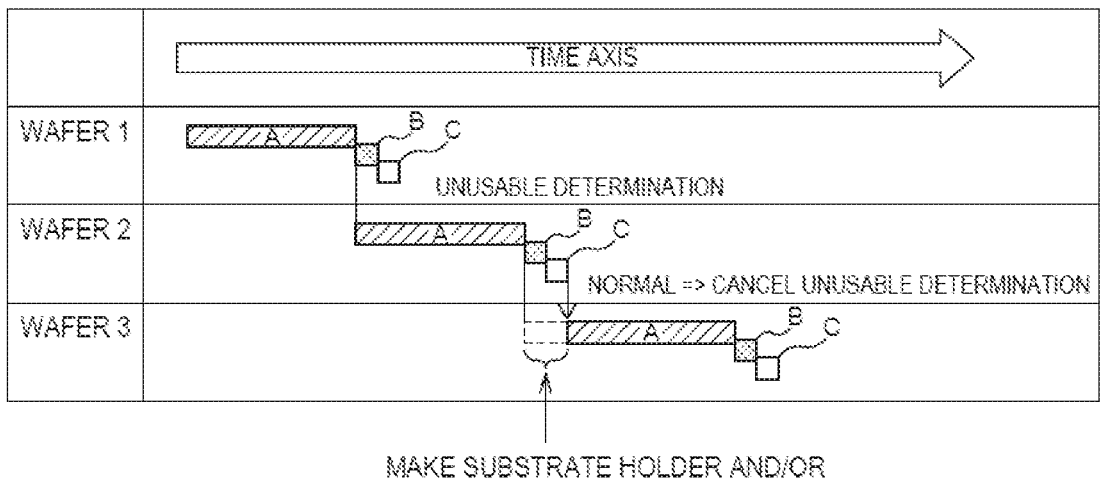
FIG. 24 is a time chart of the substrate processing to describe cancellation of non-use.

FIGS. 22 to 24 are time charts of substrate processing. The configuration of the embodiment described above aims to promptly detect a failure of a substrate holder and/or a plating module by performing an inspection for the bump height on the substrate. In some cases, however, the abnormality of the bump height on the substrate may be attributable to an abnormality of the substrate, and the substrate holder used to hold the substrate and/or the plating module may be normal. Even in the case where the result of the bump height inspection for a substrate indicates abnormality, it is preferable to cancel the alarm determination L or the unusable determination LL made with regard to the substrate holder and/or the plating module and make the substrate holder and/or the plating module usable when the result of the bump height inspection for a next substrate that is processed by using the same substrate holder and/or the same plating module indicates no abnormality. The embodiment is thus configured to cancel the alarm determination or the unusable determination according to the result of the bump height inspection for a next substrate that is processed subsequent to a substrate for which the alarm determination or the unusable determination is made.

The following describes an example of processing wafers 1 to 3 (substrates) by using an identical substrate holder and/or an identical plating module. In these charts, a process A denotes the processing of the substrate other than the processing in the dryer 106 (Si to S7 in FIG. 3): a process B denotes the cleaning/drying process in the dryer 106 (S8 in FIG. 3); and a process C denotes the bump height inspection (S9 in FIG. 3).

As shown in FIG. 22, at the timing when the process A is terminated and the process B is started with regard to the wafer 1, the process A is started with regard to the wafer 2. Similarly, at the timing when the process A is terminated and the process B is started with regard to the wafer 2, the process A is started with regard to the wafer 3. At the time when the result of the bump height inspection of the process C is obtained (at the time when the process C is terminated), the process (process A) of the next wafer 2 has already been started by using the substrate holder and/or the plating module that have been used for the processing of the wafer 1. Accordingly, even when the result of the bump height inspection with regard to the wafer 1 is the unusable determination (LL), the processing of the wafer 2 has already been started and is continued by using the same substrate holder and/or the same plating module. When the result of the bump height inspection with regard to the wafer 1 is the unusable determination (LL), the process of making the same substrate holder and/or the same plating module unusable (shown in FIG. 24) is thus not applied to the next wafer 2 but is applied to the wafer 3 after the next.

As shown in FIG. 23, when the result of the bump height inspection with regard to the wafer 1 is the alarm determination (L) and the result of the bump height inspection with regard to the wafer 2 is normal, the alarm determination (L) with regard to the corresponding substrate holder and/or the corresponding plating module is cancelled. As a result, generation of an alarm is stopped after the bump height inspection of the wafer 2. For example, an alarm for encouraging the maintenance that is displayed on GUI is eliminated. In the configuration of performing the process of actually generating an alarm after the alarm determination is made a predetermined number of times successively or cumulatively, when the normal determination is made for a subsequent substrate after the alarm determination, the cumulative number of the alarm determination may not be incremented, may be decremented or may be reset, in response to the normal determination. Even in the case of actually generating an alarm after the alarm determination is made a predetermined number of times, the process of generating the alarm may be cancelled when the normal determination is made for subsequent substrates a predetermined number of times (which may be identical with or different from the above predetermined number of times) successively or cumulatively.

In the case where the plating apparatus is provided with a cleaning mechanism of the substrate holder, an applicable procedure may transfer the substrate holder having the alarm determination (L) to the cleaning mechanism to be cleaned and subsequently resume the plating process of the substrate by using the cleaned substrate holder. The processing of the substrate by using the cleaned substrate holder increases the possibility of cancellation of the alarm determination (L).

As shown in FIG. 24, when the result of the bump height inspection with regard to the wafer 1 is the unusable determination (LL) and the result of the bump height inspection with regard to the wafer 2 is normal, the unusable determination (LL) with regard to the corresponding substrate holder and/or the corresponding plating module is cancelled after the bump height inspection of the wafer 2. As a result, after the cancellation of the unusable determination (LL), the processing of the wafer 3 is resumed by using the substrate holder and/or the plating module that were once made unusable.

The use of the substrate holder and/or the plating module for the wafer 3 has been prohibited, in response to the unusable determination (LL) as the result of the bump height inspection with regard to the wafer 1. Accordingly, as shown in FIG. 24, at the time when the process A is terminated with regard to the wafer 2, the process A has not yet been started with regard to the wafer 3 by using the same substrate holder and/or the same plating module. The processing of the wafer 3 by using the same substrate holder and/or the same plating module is thus resumed after the result of the bump height inspection with regard to the wafer 2 indicates normality and the unusable determination (LL) is cancelled.

In the configuration of performing the process of actually generating an alarm and/or actually prohibiting the use after the unusable determination is made a predetermined number of times successively or cumulatively, when the normal determination is made for a subsequent substrate after the unusable determination, the cumulative number of the unusable determination may not be incremented, may be decremented or may be reset, in response to the normal determination.

In the case where the substrate holder having the unusable determination (LL) is used for the plating process, it is generally required to manually cancel the unusable determination (LL) after the maintenance of the substrate holder. The configuration of allowing the set unusable determination (LL) to be cancelled according to the processing result of a next wafer as described above suppresses a maintenance from being unnecessarily performed and suppresses a reduction in throughput.

In the case where the plating apparatus is provided with a cleaning mechanism of the substrate holder, an applicable procedure may transfer the substrate holder having the unusable determination (L) to the cleaning mechanism to be cleaned, subsequently process only one substrate, determine the result of this processing, and cancel the unusable determination (LL) made with regard to the substrate holder and/or the plating module in response to the result of the normal determination. The processing of the substrate by using the cleaned substrate holder increases the possibility of cancellation of the unusable determination (LL).

As described above, even when the alarm determination (L) or the unusable determination (LL) is made with regard to a substrate (the substrate holder and/or the plating module that are used for the processing of the substrate) as the result of the bump height inspection, the alarm determination (alarm generation process) or the unusable determination (non-use process) may be cancelled, in response to a normal result of the inspection for a next substrate using the same substrate holder and/or the same plating module. The processing for subsequent substrates may then be continued by using the same substrate holder and/or the same plating module. When the abnormality of the bump height is attributed to a substrate, this configuration allows the substrate holder and/or the plating module used for the processing of the substrate to be continuously used for the processing of other substrates.

At least the following aspects are provided from the embodiments described above.

According to a first aspect, there is provided a bump height measurement device comprising: a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element; and a control device configured to calculate a height of the bump relative to the seed layer, based on the reflected light from the seed layer and the reflected light from the bump and to subtract an error caused by a refractive index of the resist layer from the height of the bump calculated based on the reflected lights, so as to correct the height of the bump.

The bump height measurement device may be provided in a plating apparatus, a polishing apparatus, a substrate processing apparatus equipped with a plating device and a polishing device, or another substrate processing apparatus. When the bump height measurement device is provided in the substrate processing apparatus, the control device of the bump height measurement device may be configured by the functions of a control device of the substrate processing apparatus or may be configured by a control device of the substrate processing apparatus in cooperation with another controller.

The configuration of this aspect enables the height of the bump on the substrate to be measured by the simple structure and the simple process. This configuration also allows the height of the bump on the substrate with the resist layer kept thereon to be measured and enables an abnormality in the height of the bump to be detected in a short time period after a bump forming process without requiring to peel off the resist layer prior to the measurement. This configuration can thus promptly stop further production of substrates having abnormality by using a component of the substrate processing apparatus (for example, a substrate holding member or a plating module) used for processing of a substrate having abnormality. Moreover, this configuration does not require the film thickness measurement of the substrate both before and after the bump forming process and thereby suppresses reduction in throughput.

Furthermore, this configuration calculates the bump height by taking into account the error caused by the refractive index of the resist layer (the effect of the refractive index of the resist layer on the optical path length to the seed layer) and accordingly enhances the calculation accuracy of the bump height.

According to a second aspect, there is provided a bump height measurement device comprising: a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer, reflected light that is directly reflected from the seed layer, and reflected light that is reflected from the bump, by the light-receiving element; and a control device configured to measure a height of the seed layer, based on the reflected light that is reflected from the seed layer via the resist layer and the reflected light that is directly reflected from the seed layer, to measure a height of the bump, based on the reflected light that is reflected from the seed layer via the resist layer and the reflected light that is reflected from the bump, and to subtract the height of the seed layer from the height of the bump, so as to obtain the height of the bump relative to the seed layer.

The configuration of this aspect has similar functions and advantageous effects to those of the configuration of the first aspect. In this aspect, however, the effect of the refractive index of the resist layer is cancelled by a procedure described below. The procedure sets the height of the seed layer covered with the resist layer as a reference height, measures the height of the bump and the height of an exposed area of the seed layer, and calculates the height of the bump as a difference between the measured height of the bump and the measured height of the seed layer. This cancels the effect of the refractive index of the resist layer on the measurement of the height of the bump and the height of the exposed area of the seed layer. This configuration also enables the accurate height of the bump to be obtained.

According to a third aspect, in the bump height measurement device of the first aspect, the error may be calculated by using the reflective index and a thickness of the resist layer set in a recipe.

The configuration of this aspect enables the height of the bump to be corrected with high accuracy by using the refractive index and the thickness of the resist layer.

According to a fourth aspect, in the bump height measurement device of any one of the first to the third aspects, the light sensor may be configured to irradiate an outer circumferential part of the substrate with the light, and the control device may be configured to obtain the height of the bump in the outer circumferential part of the substrate.

In the case where the substrate held by a substrate holding member is plated, an electrode is brought into contact with the outer circumferential part of the substrate, and electric current is supplied to the entire substrate via the electrode. Accordingly, in the event of an abnormality occurring in the height of bump to be plated, the abnormality in the height of the bump is more likely to occur in the outer circumferential part of the substrate. An applicable procedure may thus measure height data in the outer circumferential part of the substrate and detect an abnormality in the height of the bump on the substrate, based on the measurement data. This configuration narrows or reduces the measurement range and reduces the time required for the measurement.

According to a fifth aspect, in the bump height measurement device of the fourth aspect, the light sensor and the substrate may be rotated relative to each other by every predetermined angle by a substrate rotation mechanism configured to rotate the substrate or by a sensor rotation mechanism configured to rotate the light sensor around the substrate, and the light sensor may be configured to scan the outer circumferential part of the substrate.

The configuration of this aspect measures the outer circumferential part of the substrate with rotating the light sensor and the substrate relative to each other by every predetermined angle. This narrows or reduces the measurement range in each measurement.

According to a sixth aspect, there is provided a substrate processing apparatus comprising: a substrate processing module provided with one or a plurality of substrate processing units configured to perform substrate processing; a dryer configured to dry the substrate after the substrate processing; a bump height measurement device provided in the dryer; and a control device configured to control the substrate processing module, the dryer and the bump height measurement device. The bump height measurement device comprises a light sensor provided with a light source and a light-receiving element and configured to irradiate the substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element. The control device is configured to calculate a height of the bump relative to the seed layer, based on the reflected light from the seed layer and the reflected light from the bump and to subtract an error caused by a refractive index of the resist layer from the height of the bump calculated based on the reflected lights, so as to correct the height of the bump.

The substrate processing apparatus may be a plating apparatus, a polishing apparatus, a substrate processing apparatus equipped with a plating device and a polishing device, or another substrate processing apparatus. The one or the plurality of substrate processing units include a plating module and/or a polishing unit. The control device may be configured by one or a plurality of computers and/or controllers. The processing performed by the control device may be shared and performed in cooperation by the one or the plurality of computers and/or controllers. The one or the plurality of computers and/or controllers may include one or multiple among a device computer and a device controller of the substrate processing apparatus and a controller of the light sensor.

The configuration of this aspect enables the height of the bump on the substrate to be measured by the simple structure and the simple process. This configuration also allows the height of the bump on the substrate with the resist layer kept thereon to be measured and enables an abnormality in the height of the bump to be detected in a short time period after a bump forming process without requiring to peel off the resist layer prior to the measurement. This configuration can thus promptly stop further production of substrates having abnormality by using a component of the substrate processing apparatus (for example, a substrate holding member, a plating module or a polishing unit) used for processing of a substrate having abnormality. Moreover, this configuration does not require the film thickness measurement of the substrate both before and after the bump forming process and thereby suppresses reduction in throughput.

Furthermore, this configuration calculates the bump height by taking into account the error caused by the refractive index of the resist layer (the effect of the refractive index of the resist layer on the optical path length to the seed layer) and accordingly enhances the calculation accuracy of the bump height. The inspection for the bump height is performed in the dryer. This configuration prevents the complicated transfer or conveyance of the substrate and suppresses reduction in throughput.

According to a seventh aspect, there is provided a substrate processing apparatus comprising: a substrate processing module provided with one or a plurality of substrate processing units configured to perform substrate processing; a dryer configured to dry the substrate after the substrate processing; a bump height measurement device provided in the dryer; and a control device configured to control the substrate processing module, the dryer and the bump height measurement device. The bump height measurement device comprises a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer, reflected light that is directly reflected from the seed layer, and reflected light that is reflected from the bump, by the light-receiving element. The control device is configured to measure a height of the seed layer, based on the reflected light that is reflected from the seed layer via the resist layer and the reflected light that is directly reflected from the seed layer, to measure a height of the bump, based on the reflected light that is reflected from the seed layer via the resist layer and the reflected light that is reflected from the bump, and to subtract the height of the seed layer from the height of the bump, so as to obtain the height of the bump relative to the seed layer.

The configuration of this aspect has similar functions and advantageous effects to those of the configuration of the sixth aspect. In this aspect, however, the effect of the refractive index of the resist layer is cancelled by a procedure described below. The procedure sets the height of the seed layer covered with the resist layer as a reference height, measures the height of the bump and the height of an exposed area of the seed layer, and calculates the height of the bump as a difference between the measured height of the bump and the measured height of the seed layer. This cancels the effect of the refractive index of the resist layer on the measurement of the height of the bump and the height of the exposed area of the seed layer. This configuration also enables the accurate height of the bump to be obtained.

According to an eighth aspect, in the substrate processing apparatus of the sixth aspect, the error may be calculated by using the reflective index and a thickness of the resist layer set in a recipe.

The configuration of this aspect enables the height of the bump to be corrected with high accuracy by using the refractive index and the thickness of the resist layer.

According to a ninth aspect, in the substrate processing apparatus of the eighth aspect, the dryer may be provided with a substrate rotation mechanism configured to rotate and dry the substrate.

The configuration of this aspect rotates and thereby dries the substrate. Measurement of the height of a substrate surface may be performed, while the substrate is rotated by the substrate rotation mechanism.

According to a tenth aspect, in the substrate processing apparatus of any one of the sixth to the ninth aspects, the dryer may be provided with an openable shielding member configured to shield the bump height measurement device from a drying module configured to dry the substrate.

The configuration of this aspect is allowed to dry the substrate in the state that the bump height measurement device is shielded from the drying module by the shielding member in a closed position and to perform bump height inspection for the substrate in an open position of the shielding member. This configuration protects the bump height measurement device, while preventing interference with a drying process by the drying module.

According to an eleventh aspect, in the substrate processing apparatus of any one of the sixth to the tenth aspects, the substrate may be subjected to a plating process in a state that the substrate is held by a substrate holding member, and the control device may perform an inspection for the height of the bump, based on the obtained height of the bump, and make the substrate holding member used to hold the substrate and/or a plating module used for the plating process of the substrate, unusable when the height of the bump has an abnormality.

The configuration of this aspect can promptly stop production of substrates having abnormality by using the substrate holding member and/or the substrate processing module (for example, the plating module) used for processing of a substrate having abnormality.

According to a twelfth aspect, in the substrate processing apparatus of any one of the sixth to the eleventh aspects, the light sensor may be configured to irradiate an outer circumferential part of the substrate with the light, and the control device may be configured to calculate the height of the bump in the outer circumferential part of the substrate.

In the case where the substrate held by a substrate holding member is plated, an electrode is brought into contact with the outer circumferential part of the substrate, and electric current is supplied to the entire substrate via the electrode. Accordingly, in the event of an abnormality occurring in the height of bump to be plated, the abnormality in the height of the bump is more likely to occur in the outer circumferential part of the substrate. An applicable procedure may thus measure a pattern in the outer circumferential part of the substrate and detect an abnormality in the height of the bump on the substrate, based on the measurement data. This configuration narrows the measurement range and reduces the time required for the measurement.

According to a thirteenth aspect, in the substrate processing apparatus of the twelfth aspect, the light sensor and the substrate may be rotated relative to each other by every predetermined angle by a substrate rotation mechanism configured to rotate and dry the substrate or by a sensor rotation mechanism configured to rotate the light sensor around the substrate, and the light sensor may be configured to scan the outer circumferential part of the substrate.

The configuration of this aspect measures the outer circumferential part of the substrate with rotating the light sensor and the substrate relative to each other by every predetermined angle. This narrows the measurement range in each measurement.

Furthermore, in a configuration that an imaging device and the substrate are rotated relative to each other by a substrate rotation mechanism for substrate drying provided in the dryer, using the existing substrate rotation mechanism for substrate drying as a substrate scanning device during imaging can omit an additional rotation mechanism provided to rotate the light sensor along the outer circumferential part of the substrate.

According to a fourteenth aspect, there is provided a method of measuring a bump height comprising: irradiating a substrate including a seed layer, a resist layer formed on the seed layer and a bump formed in an opening of the resist layer, with light emitted from a light source and detecting reflected light that is reflected from the seed layer via the resist layer and reflected light that is reflected from the bump, by a light-receiving element; and calculating a height of the bump relative to the seed layer, based on the reflected light from the seed layer and the reflected light from the bump and subtracting an error caused by a refractive index of the resist layer from the height of the bump calculated based on the reflected lights, so as to correct the height of the bump.

The configuration of this aspect has similar functions and advantageous effects to those of the configuration of the first aspect.

According to a fifteenth aspect, there is provided a method of measuring a bump height comprising: irradiating a substrate including a seed layer, a resist layer formed on the seed layer and a bump formed in an opening of the resist layer, with light emitted from a light source and detecting reflected light that is reflected from the seed layer via the resist layer, reflected light that is directly reflected from the seed layer, and reflected light that is reflected from the bump, by a light-receiving element; and measuring a height of the seed layer, based on the reflected light that is reflected from the seed layer via the resist layer and the reflected light that is directly reflected from the seed layer, measuring a height of the bump, based on the reflected light that is reflected from the seed layer via the resist layer and the reflected light that is reflected from the bump, and subtracting the height of the seed layer from the height of the bump, so as to obtain the height of the bump relative to the seed layer. The configuration of this aspect has similar functions and advantageous effects to those of the configuration of the second aspect.

According to a sixteenth aspect, there is provided a storage medium configured to store a program that causes a computer to perform a method of controlling a bump height measurement device. The program causes the computer to: irradiate a substrate including a seed layer, a resist layer formed on the seed layer and a bump formed in an opening of the resist layer, with light emitted from a light source and detect reflected light that is emitted from the light source, passes through the resist layer and is reflected from the seed layer and reflected light that is emitted from the light source and is reflected from the bump, by a light-receiving element; and calculate a height of the bump relative to the seed layer, based on the reflected light from the seed layer and the reflected light from the bump and subtract an error caused by a refractive index of the resist layer from the height of the bump calculated based on the reflected lights, so as to correct the height of the bump.

The configuration of this aspect has similar functions and advantageous effects to those of the configuration of the first aspect.

According to a seventeenth aspect, there is provided a storage medium configured to store a program that causes a computer to perform a method of controlling a bump height measurement device. The program causes the computer to: irradiate a substrate including a seed layer, a resist layer formed on the seed layer and a bump formed in an opening of the resist layer, with light emitted from a light source and detect reflected light that is reflected from the seed layer via the resist layer, reflected light that is directly reflected from the seed layer, and reflected light that is reflected from the bump, by a light-receiving element; and measure a height of the seed layer, based on the reflected light that is reflected from the seed layer via the resist layer and the reflected light that is directly reflected from the seed layer, measure a height of the bump, based on the reflected light that is reflected from the seed layer via the resist layer and the reflected light that is reflected from the bump, and subtract the height of the seed layer from the height of the bump, so as to obtain the height of the bump relative to the seed layer.

The configuration of this aspect has similar functions and advantageous effects to those of the configuration of the second aspect.

According to an eighteenth aspect, in the substrate processing apparatus of any one of the sixth to the thirteenth aspects, the bump height measurement device may perform measurement of bump height with regard to plural measurement areas on the substrate. The control device may perform tentative determination for presence or absence of any abnormality in bump height with regard to each measurement area where the measurement is performed, and may perform final determination with regard to one measurement area by using a result of the tentative determination with regard to the one measurement area and results of the tentative determination with regard to one or plural other measurement areas including the one measurement area.

The configuration of this aspect performs final determination with regard to one measurement area by using the determination results (tentative determination results) of other measurement areas in addition to the determination result (tentative determination result) of the one measurement area. This configuration enhances the accuracy of evaluation of the bump height in the substrate even when a measurement value of an optical sensor has a measurement noise due to, for example, the fact that the light reflected by a bump is not sufficiently returned to the sensor according to the shape and the properties of a bump end. For example, this configuration reduces the risk of wrong detection of an abnormality of the bump height (alarm determination or unusable determination) due to the measurement noise of the optical sensor and the risk of generating an alarm and/or setting non-use based on the wrong detection.

According to a nineteenth aspect, in the substrate processing apparatus of any one of the sixth to the thirteenth aspects, the bump height measurement device may perform measurement of bump height with regard to plural measurement areas on the substrate. The control device may perform determination for presence or absence of any abnormality in bump height with regard to each measurement area where the measurement is performed. The control device may set one or a plurality of determination areas including a plurality of the measurement areas, on the substrate, and may perform determination for bump height inspection with regard to each determination area by using results of the determination with regard to the plurality of the measurement areas included in the determination area. The result of the determination with regard to the measurement area is, for example, the tentative determination result or the final determination result described above.

The configuration of this aspect sets a determination area that is wider than a measurement area and performs the determination with regard to the determination area by using the determination results with regard to a plurality of measurement areas included in the determination area, in addition to performing the determination with regard to the measurement area. This configuration further reduces the influence of the measurement noise.

According to a twentieth aspect, in the substrate processing apparatus of the eighteenth aspect, the control device may set one or a plurality of determination areas including a plurality of the measurement areas, on the substrate, and may perform determination for bump height inspection with regard to each determination area by using results of tentative determination or results of final determination with regard to the plurality of the measurement areas included in the determination area.

The configuration of this aspect additionally sets a determination area that is wider than a measurement area and performs the determination with regard to the determination area by using the determination results with regard to a plurality of measurement areas included in the determination area. This configuration further reduces the influence of the measurement noise. Moreover, in the configuration of using the final determination results of the respective measurement areas, the effect of further reducing the measurement noise in the determination area by using the determination results of the respective measurement areas with the reduced measurement noises is added to the effect of reducing the measurement noise with regard to each measurement area. This configuration accordingly further enhances the effect of reducing the measurement noise.

According to a twenty-first aspect, in the substrate processing apparatus of either the nineteenth aspect or the twentieth aspect, the control device may perform the determination with regard to each determination area according to number of measurement areas determined abnormal in an identical determination area and at an identical position in a radial direction on the substrate. The determination of the abnormality include, for example, the alarm determination (L) and the unusable determination (LL) described above.

In the case of a circular substrate, the position in a radial direction on the substrate is varied according to the distance from a power feed electrode (contact). In the case of a failure occurring in the power feed electrode (contact), a similar influence is likely to occur in the bump height at an identical radial direction position on the substrate (on a circumference of an identical diameter). This configuration performs the determination with regard to a determination area, based on the determination results of measurement areas included in the identical determination area and at an identical radial direction position. This accordingly further enhances the accuracy of the determination. This configuration performs the determination with regard to a determination area, based on the determination results of measurement areas included in the identical determination area and at an identical radial direction position. This accordingly further enhances the accuracy of the determination.

According to a twenty-second aspect, in the substrate processing apparatus of any one of the eighteenth to the twenty-first aspects, the control device may perform determination with regard to a measurement area, based on whether a maximum value and a minimum value among values of the bump height measured with regard to the measurement area are within a predetermined range.

The configuration of this aspect performs determination, based on the maximum value and the minimum value among the values of the bump height measured in the measurement area. This further reduces the influence of the measurement noise.

According to a twenty-third aspect, in the substrate processing apparatus of any one of the eighteenth to the twenty-second aspects, the control device may exclude any value of the bump height exceeding a predetermined numerical value range among values of the bump height measured with regard to a measurement area and perform determination with regard to the measurement area, based on values of the bump height after the exclusion.

The configuration of this aspect excludes any clearly abnormal value that is generally not attributable to the plating apparatus (any abnormal measurement value generally improbable as the result of plating, for example, a measurement value of the light sensor including a measurement noise due to, for example, the fact that the light reflected by the bump is not sufficiently returned to the sensor according to the shape and the properties of a bump end). This further enhances the accuracy of the determination of the bump height.

According to a twenty-fourth aspect, in the substrate processing apparatus of any one of the sixth to the tenth aspects, the substrate may be subjected to a plating process in a state that the substrate is held by a substrate holding member. The control device may perform an inspection for the height of the bump on the substrate, based on the obtained height of the bump, and when the height of the bump on the substrate has an abnormality, may make an abnormality determination with regard to the substrate holding member and/or a plating module used for processing of the substrate. The control device may perform an inspection for the height of the bump on a next substrate subsequent to the substrate having the abnormality determination, and when the height of the bump on the next substrate has no abnormality, may cancel the abnormality determination with regard to the substrate holding member and/or the plating module.

In the case where the substrate holding member and/or the plating module have no abnormality but an abnormality of the bump height is detected due to the substrate, the configuration of this aspect cancels the abnormality determination with regard to the substrate holding member and/or the plating module and allows the substrate holding member and/or the plating module to be continuously used. The substrate holding member is, for example, a substrate holder.

According to a twenty-fifth aspect, in the substrate processing apparatus of the twenty-fourth aspect, the abnormality determination may include or may be accompanied with generation of an alarm and/or setting of non-use with regard to the substrate holding member and/or the plating module.

The configuration of this aspect is allowed to cancel the generation of the alarm and/or the setting of non-use in the case where an abnormality in the bump height due to the substrate is detected.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited. For example, in the embodiment of the present disclosure described above, the bump height measurement device is placed in the dryer provided in the plating apparatus. It is, however, not necessary to place the bump height measurement device in the plating apparatus. In another example, in the embodiment of the present disclosure described above, the measurement areas 400 are arranged along a rotating direction and a radial direction of the substrate W. According to a modification, measurement areas may be arranged in both vertical and horizontal directions on an X-Y plane, and a robot or the like may be configured to scan the light sensor 201 such as to take images along the vertical and horizontal directions (this configuration is applicable to a substrate in any arbitrary shape but is especially employable for a non-circular substrate such as a rectangular (polygonal) substrate).

The present application claims priority from the Japanese patent application No. 2018-125427 filed on Jun. 29, 2018. The entire disclosure of the Japanese patent application No. 2018-125427 filed on Jun. 29, 2018, including the specification, the claims, the drawings and the abstract is incorporated herein by reference in its entirety.

The entire disclosures of Japanese Unexamined Patent Publication No. 2002-190455 (Patent Document 1), including the specification, the claims, the drawings and the abstract are incorporated herein by reference in its entirety.

REFERENCE SIGNS LIST

100 substrate processing apparatus
101A load/unload module
101B processing module 102 cassette table
103 substrate transporter
103a transfer robot
104 aligner
105 substrate mounting/demounting module
105a substrate mounting/demounting device
106 dryer
107 stocker
108 pre-wet module
109 blow module
110 rinse module
112 plating process module
112a plating cell
113 substrate holder transfer device
114 first transporter
115 second transporter
116 rail
120 control device
120A CPU
120B memory
131 housing
132 substrate rotation mechanism
133 shutter
134 nozzle
200 bump height measurement device
201 light sensor
202 controller
203 Z-axis robot
204 X-axis robot

The invention claimed is:

1. A device for measuring a bump height, comprising:
a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element; and
a processor and memory containing computer readable instructions that when executed by the processor configure the processor to calculate a height of the bump relative to the seed layer, based on the reflected light from the seed layer and the reflected light from the bump and to subtract an error caused by a refractive index of the resist layer from the height of the bump calculated based on the reflected lights, so as to correct the height of the bump.

2. The device according to claim 1,
wherein the error is calculated by using the reflective index and a thickness of the resist layer set in a recipe.

3. The device according to claim 1,
wherein the light sensor is configured to irradiate an outer circumferential part of the substrate with the light, and the memory containing computer readable instructions that when executed by the processor configure the processor to obtain the height of the bump in the outer circumferential part of the substrate.

4. The device according to claim 3,
wherein the light sensor and the substrate are rotated relative to each other by every predetermined angle by a substrate rotation mechanism configured to rotate the substrate or by a sensor rotation mechanism configured to rotate the light sensor around the substrate, and the light sensor is configured to scan the outer circumferential part of the substrate.

5. A device for measuring a bump height, comprising:
a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer, reflected light that is directly reflected from the seed layer, and reflected light that is reflected from the bump, by the light-receiving element; and
a processor and memory containing computer readable instructions that when executed by the processor configure the processor to measure a height of the seed layer, based on the reflected light that is reflected from the seed layer via the resist layer and the reflected light that is directly reflected from the seed layer, to measure a height of the bump, based on the reflected light that is reflected from the seed layer via the resist layer and the reflected light that is reflected from the bump, and to subtract the height of the seed layer from the height of the bump, so as to obtain the height of the bump relative to the seed layer.

6. An apparatus for processing a substrate, comprising:
a substrate processing module provided with one or a plurality of substrate processing units configured to perform substrate processing;
a dryer configured to dry the substrate after the substrate processing;
a bump height measurement device provided in the dryer; and
a processor and memory containing computer readable instructions that when executed by the processor configure the processor to control the substrate processing module, the dryer and the bump height measurement device, wherein
the bump height measurement device comprises a light sensor provided with a light source and a light-receiving element and configured to irradiate the substrate including a seed layer, a resist layer formed on the seed layer and a bump formed in an opening of the resist layer, with light emitted from the light source and to detect reflected light that is reflected from the seed layer via the resist layer and reflected light that is reflected from the bump, by the light-receiving element, and
the memory containing computer readable instructions that when executed by the processor configure the processor to calculate a height of the bump relative to the seed layer, based on the reflected light from the seed layer and the reflected light from the bump and to subtract an error caused by a refractive index of the resist layer from the height of the bump calculated based on the reflected lights, so as to correct the height of the bump.

7. The apparatus according to claim 6,
wherein the error is calculated by using the reflective index and a thickness of the resist layer set in a recipe.

8. The apparatus according to claim 6,
wherein the dryer is provided with a substrate rotation mechanism configured to rotate and dry the substrate.

9. The apparatus according to claim 6,
wherein the dryer is provided with an openable shielding member configured to shield the bump height measurement device from a drying module configured to dry the substrate.

10. The apparatus according to claim 6,
wherein the substrate is subjected to a plating process in a state that the substrate is held by a substrate holding member, and
the memory containing computer readable instructions that when executed by the processor configure the processor to perform an inspection for the height of the bump, based on the obtained height of the bump, and make the substrate holding member used to hold the substrate and/or a plating module used for the plating process of the substrate, unusable when the height of the bump has an abnormality.

11. The apparatus according to claim 6,
wherein the light sensor is configured to irradiate an outer circumferential part of the substrate with the light, and
the memory containing computer readable instructions that when executed by the processor configure the processor to calculate the height of the bump in the outer circumferential part of the substrate.

12. The apparatus according to claim 11,
wherein the light sensor and the substrate are rotated relative to each other by every predetermined angle by a substrate rotation mechanism configured to rotate and dry the substrate or by a sensor rotation mechanism configured to rotate the light sensor around the substrate, and the light sensor is configured to scan the outer circumferential part of the substrate.

13. The substrate processing apparatus according to claim 6,
wherein the bump height measurement device performs measurement of bump height with regard to plural measurement areas on the substrate, and
the memory containing computer readable instructions that when executed by the processor configure the processor to perform a tentative determination for presence or absence of any abnormality in bump height with regard to each measurement area where the measurement is performed, and perform final determination with regard to one measurement area by using a result of the tentative determination with regard to the one measurement area and results of the tentative determination with regard to one or plural other measurement areas including the one measurement area.

14. The apparatus according to claim 13,
wherein the memory containing computer readable instructions that when executed by the processor configure the processor to set one or a plurality of determination areas including a plurality of the measurement areas, on the substrate, and performs determination for bump height inspection with regard to each determination area by using results of tentative determination or results of final determination with regard to the plurality of the measurement areas included in the determination area.

15. The apparatus according to claim 13,
wherein the memory containing computer readable instructions that when executed by the processor configure the processor to perform determination with regard to a measurement area, based on whether a maximum value and a minimum value among values of the bump height measured with regard to the measurement area are within a predetermined range.

16. The apparatus according to claim 13,
wherein the memory containing computer readable instructions that when executed by the processor configure the processor to exclude any value of the bump height exceeding a predetermined numerical value range among values of the bump height measured with regard to a measurement area and performs determination with regard to the measurement area, based on values of the bump height after the exclusion.

17. The apparatus according to claim 6,
wherein the bump height measurement device performs measurement of bump height with regard to plural measurement areas on the substrate,
the memory containing computer readable instructions that when executed by the processor configure the processor to perform a determination for presence or absence of any abnormality in bump height with regard to each measurement area where the measurement is performed, and
the memory containing computer readable instructions that when executed by the processor configure the processor to set one or a plurality of determination areas including a plurality of the measurement areas, on the substrate, and perform determination for bump height inspection with regard to each determination area by using results of the determination with regard to the plurality of the measurement areas included in the determination area.

18. The apparatus according to claim 17,
wherein the memory containing computer readable instructions that when executed by the processor configure the processor to perform the determination with regard to each determination area according to number of measurement areas determined abnormal in an identical determination area and at an identical position in a radial direction on the substrate.

19. The apparatus according to claim 6,
wherein the substrate is subjected to a plating process in a state that the substrate is held by a substrate holding member,
the memory containing computer readable instructions that when executed by the processor configure the processor to perform an inspection for the height of the bump on the substrate, based on the obtained height of the bump, and when the height of the bump on the substrate has an abnormality, makes an abnormality determination with regard to the substrate holding member and/or a plating module used for processing of the substrate, and
the memory containing computer readable instructions that when executed by the processor configure the processor to perform an inspection for the height of the bump on a next substrate subsequent to the substrate having the abnormality determination, and when the height of the bump on the next substrate has no abnormality, cancel the abnormality determination with regard to the substrate holding member and/or the plating module.

20. The apparatus according to claim 19,
wherein the abnormality determination includes or is accompanied with generation of an alarm and/or setting of non-use with regard to the substrate holding member and/or the plating module.

21. An apparatus for processing a substrate, comprising:
a substrate processing module provided with one or a plurality of substrate processing units configured to perform substrate processing;
a dryer configured to dry the substrate after the substrate processing;
a bump height measurement device provided in the dryer; and a processor and memory containing computer readable instructions that when executed by the processor configure the processor to control the substrate processing module, the dryer and the bump height measurement device, wherein the bump height measurement device comprises a light sensor provided with a light source and a light-receiving element and configured to irradiate a substrate including a seed layer, a resist layer formed on the seed layer and a bump formed in an opening of the resist layer, with light emitted from the light source and to detect reflected light that is reflected from the seed layer via the resist layer, reflected light that is directly reflected from the seed layer, and reflected light that is reflected from the bump, by the light-receiving element, and the memory containing computer readable instructions that when executed by the processor configure the processor to measure a height of the seed layer, based on the reflected light that is reflected from the seed layer via the resist layer and the reflected light that is directly reflected from the seed layer, to measure a height of the bump, based on the reflected light that is reflected from the seed layer via the resist layer and the reflected light that is reflected from the bump, and to subtract the height of the seed layer from the height of the bump, so as to obtain the height of the bump relative to the seed layer.

22. A method of measuring a bump height, comprising:
irradiating a substrate including a seed layer, a resist layer formed on the seed layer and a bump formed in an opening of the resist layer, with light emitted from a light source and detecting reflected light that is reflected from the seed layer via the resist layer and reflected light that is reflected from the bump, by a light-receiving element; and calculating a height of the bump relative to the seed layer, based on the reflected light from the seed layer and the reflected light from the bump and subtracting an error caused by a refractive index of the resist layer from the height of the bump calculated based on the reflected lights, so as to correct the height of the bump.

23. A method of measuring a bump height, comprising:
irradiating a substrate including a seed layer, a resist layer formed on the seed layer and a bump formed in an opening of the resist layer, with light emitted from a light source and detecting reflected light that is reflected from the seed layer via the resist layer, reflected light that is directly reflected from the seed layer, and reflected light that is reflected from the bump, by a light-receiving element; and measuring a height of the seed layer, based on the reflected light that is reflected from the seed layer via the resist layer and the reflected light that is directly reflected from the seed layer, measuring a height of the bump, based on the reflected light that is reflected from the seed layer via the resist layer and the reflected light that is reflected from the bump, and subtracting the height of the seed layer from the height of the bump, so as to obtain the height of the bump relative to the seed layer.

24. A non-transitory computer-readable medium containing computer instructions stored therein
for causing a processor to:
irradiate a substrate including a seed layer, a resist layer formed on the seed layer and a bump formed in an opening of the resist layer, with light emitted from a light source and detect reflected light that is emitted from the light source, passes through the resist layer and is reflected from the seed layer and reflected light that is emitted from the light source and is reflected from the bump, by a light-receiving element; and calculate a height of the bump relative to the seed layer, based on the reflected light from the seed layer and the reflected light from the bump and subtract an error caused by a refractive index of the resist layer from the height of the bump calculated based on the reflected lights, so as to correct the height of the bump.

25. A non-transitory computer-readable medium containing computer instructions stored therein
for causing a processor to:
irradiate a substrate including a seed layer, a resist layer formed on the seed layer and a bump formed in an opening of the resist layer, with light emitted from a light source and detect reflected light that is reflected from the seed layer via the resist layer, reflected light that is directly reflected from the seed layer, and reflected light that is reflected from the bump, by a light-receiving element; and measure a height of the seed layer, based on the reflected light that is reflected from the seed layer via the resist layer and the reflected light that is directly reflected from the seed layer, measure a height of the bump, based on the reflected light that is reflected from the seed layer via the resist layer and the reflected light that is reflected from the bump, and subtract the height of the seed layer from the height of the bump, so as to obtain the height of the bump relative to the seed layer.

* * * * *